US011464113B2

(12) United States Patent
Lee et al.

(10) Patent No.: US 11,464,113 B2
(45) Date of Patent: Oct. 4, 2022

(54) PRINTED CIRCUIT BOARD ASSEMBLY

(71) Applicant: LG Magna e-Powertrain Co., Ltd., Incheon (KR)

(72) Inventors: Jonggyu Lee, Seoul (KR); Sangyub Kim, Seoul (KR); Joonhwan Lee, Seoul (KR); Junho Ahn, Seoul (KR)

(73) Assignee: LG MAGNA E-POWERTRAIN CO., LTD., Incheon (KR)

( * ) Notice: Subject to any disclaimer, the term of this patent is extended or adjusted under 35 U.S.C. 154(b) by 79 days.

(21) Appl. No.: 16/791,897

(22) Filed: Feb. 14, 2020

(65) Prior Publication Data

US 2020/0267841 A1 Aug. 20, 2020

(30) Foreign Application Priority Data

Feb. 15, 2019 (KR) .................. 10-2019-0017597
Jun. 26, 2019 (KR) .................. 10-2019-0076470

(51) Int. Cl.
*H05K 1/18* (2006.01)
*G01R 15/20* (2006.01)

(52) U.S. Cl.
CPC ............ *H05K 1/181* (2013.01); *G01R 15/20* (2013.01); *G01R 15/202* (2013.01); *H05K 1/184* (2013.01); *H05K 2201/0191* (2013.01); *H05K 2201/10151* (2013.01); *H05K 2201/10272* (2013.01);
(Continued)

(58) Field of Classification Search
CPC ............... H05K 1/181; H05K 1/184; H05K 2201/0191; H05K 2201/10151; H05K 2201/10272; H05K 2201/10371; H05K 2201/10545; H05K 9/0024; H05K 9/0028;
(Continued)

(56) References Cited

U.S. PATENT DOCUMENTS 9,372,240 B2 * 6/2016 Tamura ................. G01R 15/20
2009/0121704 A1 * 5/2009 Shibahara ............ G01R 15/202
324/117 R
2012/0112365 A1 5/2012 Ausserlechner et al.
(Continued)

FOREIGN PATENT DOCUMENTS

JP H07-44041 10/1995
JP 2008-102116 A 5/2008
(Continued)

OTHER PUBLICATIONS

Hyundai Motor Co LTD, English Translation KR20100029390 (Year: 2010).*

(Continued)

*Primary Examiner* — Steven T Sawyer
(74) *Attorney, Agent, or Firm* — Birch, Stewart, Kolasch & Birch, LLP

(57) ABSTRACT

A printed circuit board assembly is disclosed. The printed circuit board assembly includes a printed circuit board, a sensor mounted on one side of the printed circuit board to detect a magnetic field, and a bus bar disposed in contact with another side of the printed circuit board, wherein a thickness between a region of the another side of the printed circuit board, with which the bus bar is in contact, and the one side of the printed circuit board is smaller than a thickness between a remaining region of the another side of the printed circuit board and the one side of the printed circuit board.

16 Claims, 28 Drawing Sheets

(52) U.S. Cl.
CPC .............. *H05K 2201/10371* (2013.01); *H05K 2201/10545* (2013.01)

(58) Field of Classification Search
CPC .. G01R 15/207; G01R 15/202; G01R 15/205; G01R 33/091; G01R 15/20
See application file for complete search history.

(56) References Cited

U.S. PATENT DOCUMENTS

| | | | |
|---|---|---|---|
| 2018/0206359 A1 | 7/2018 | McPherson et al. | |
| 2019/0187187 A1* | 6/2019 | Umetsu | H01R 25/16 |
| 2019/0212372 A1* | 7/2019 | Bilbao De Mendizabal | G01R 33/0005 |
| 2019/0320524 A1* | 10/2019 | Niu | G01R 19/0092 |
| 2020/0096542 A1* | 3/2020 | Tsuzaki | G01R 19/0092 |

FOREIGN PATENT DOCUMENTS

| | | |
|---|---|---|
| JP | 5198173 | 5/2013 |
| JP | 2015-017862 A | 1/2015 |
| KR | 10-2010-0029390 | 3/2010 |
| KR | 10-1398219 | 5/2014 |

OTHER PUBLICATIONS

Communication and Search Report issued from the Korean Patent Office in Application No. 10-2019-0076470 dated Apr. 19, 2021 (5 pages).

Communication and Search Report, issued from the European Patent Office in Application No. 20157409.2-1010. dated Aug. 20, 2020 (7 pages).

Notice of Allowance issued from the Korean Patent Office in Korean Application No. 10-2019-0076470 dated Oct. 20, 2021 (2 pages).

\* cited by examiner

10

(a)

(b)

PRINTED CIRCUIT BOARD ASSEMBLY

CROSS-REFERENCE TO RELATED APPLICATION

This application claims the priority benefit of Korean Patent Application No. 10-2019-0017597, filed on Feb. 15, 2019 and Korean Patent Application No. 10-2019-0076470, filed on Jun. 26, 2019, in the Korean Intellectual Property Office, the disclosure of which is incorporated herein by reference.

BACKGROUND OF THE INVENTION

1. Field of the invention

The present disclosure relates to a printed circuit board assembly, and more particularly to a printed circuit board assembly capable of precisely detecting current flowing through a bus bar through a sensor mounted on a printed circuit board (PCB).

2. Description of the Related Art

Generally, devices that are designed to be operated using electric power are operated by receiving electric power from a power source via a wire. Furthermore, devices designed to be operated using a large amount of electric power receive electric power via a bus bar, which allows a large amount of electric power to flow therethrough.

In order to achieve improvement in performance and efficient control of devices, there is a need to precisely measure the amount of current flowing through the devices. To this end, magnetic sensors for detecting a magnetic field induced by the current flowing through a wire, are used. For example, Related art 1 (Korean Unexamined Patent Publication No. 10-2011-0122421) discloses a printed circuit board, which is provided with a magnetic sensor mounted thereon and is capable of being attached to and detached from a bus bar connected to a battery.

However, previous approaches make it difficult to hold a printed circuit board on a bus bar. Hence, in application where there is frequent occurrence of vibration, such as in an automobile, the printed circuit board with a magnetic sensor mounted thereon and the bus bar may vibrate independently, thereby causing the magnetic sensor to imprecisely detect a magnetic field. Furthermore, if the magnetic sensor imprecisely detects a magnetic field, it is impossible to precisely measure the amount of current supplied to the device, thereby making control of the device unstable. As a result, various problems in control of the device may occur, such as vibration of the automobile and inappropriate occurrence of acceleration or deceleration.

SUMMARY OF THE INVENTION

Therefore, the present disclosure has been made in view of the above problems, and it is an object of the present disclosure to provide a printed circuit board assembly capable of precisely detecting the amount of current flowing through a bus bar even when a printed circuit board and the bus bar vibrate.

In accordance with an aspect of the present disclosure, the above and other objects can be accomplished by the provision of a printed circuit board assembly including a printed circuit board, a sensor mounted on one side of the printed circuit board to detect a magnetic field, and a bus bar disposed in contact with the other side of the printed circuit board, wherein the thickness between the region of the other side of the printed circuit board, with which the bus bar is in contact, and the one side of the printed circuit board is smaller than the thickness between the remaining region of the other side of the printed circuit board, excluding the region of the other side of the printed circuit board, with which the bus bar is in contact, and the one side of the printed circuit board.

In accordance with another aspect of the present disclosure, there is provided a printed circuit board assembly including a holding member configured to prevent the bus bar in contact with the front side of the printed circuit board from being spaced apart from a shield disposed on the top of the bus bar.

In accordance with a further aspect of the present disclosure, there is provided a printed circuit board assembly including a printed circuit board, a bus bar disposed in contact with the front side of the printed circuit board, a sensor mounted on the rear side of the printed circuit board to detect a magnetic field, a shield disposed surrounding at least a portion of the bus bar, and a holding member disposed in contact with the shield.

In accordance with still another aspect of the present disclosure, there is provided a printed circuit board assembly including a printed circuit board, a plurality of bus bars disposed in contact with the front side of the printed circuit board, a plurality of sensors mounted on the rear side of the printed circuit board to detect a magnetic field, a plurality of shields disposed surrounding at least a portion of a corresponding one of the plurality of bus bars, and a holding member disposed in contact with the plurality of shields.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Hereinafter, the present disclosure will be described in detail with reference to the accompanying drawings. For the purpose of clear and brief description of the present disclosure, illustrations of parts irrelevant to the description will be omitted. The same reference numbers will be used throughout this specification to refer to the same or similar components.

Suffixes such as "module" and "unit", which are used in the following description, may be used to refer to elements or components for easy preparation of the specification, and the suffixes do not have any special meaning or function. Accordingly, the suffixes such as "module" and "unit" may be used in an interchangeable manner.

Terms such as "includes" or "has" used herein should be considered to indicate the presence of several features, numbers, steps, operations, elements, components or combinations thereof disclosed in the specification, but it should be understood that one or more other features, numbers, steps, operations, elements, components or combinations thereof may similarly be present or added.

It will be understood that although the terms "first", "second", etc. may be used herein to describe various elements, these elements should not be limited by these terms. These terms are only used to distinguish one element from another.

Figure 1A:
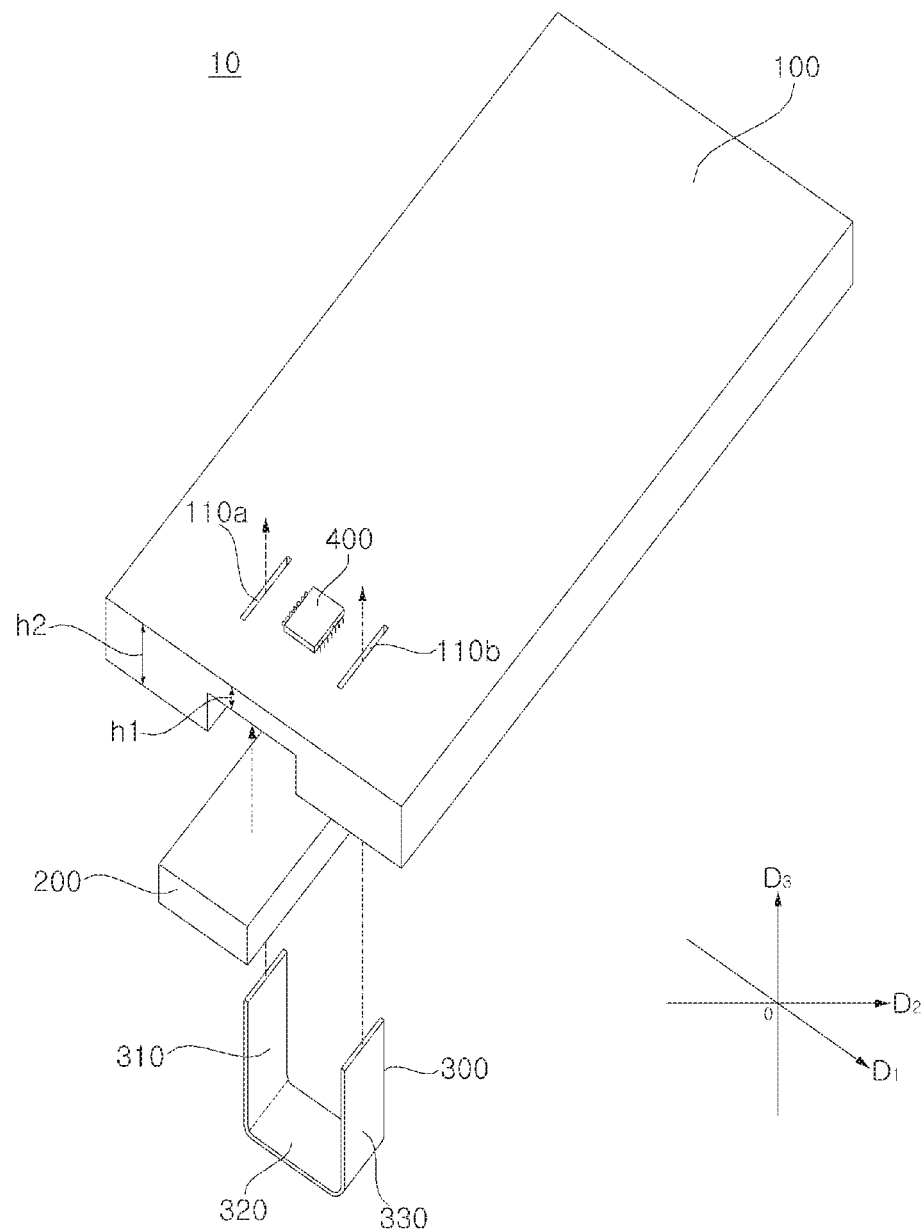
FIG. 1A is an exploded perspective view of a printed circuit board assembly according to an embodiment of the present disclosure, which is viewed in one direction.
Figure 1B:
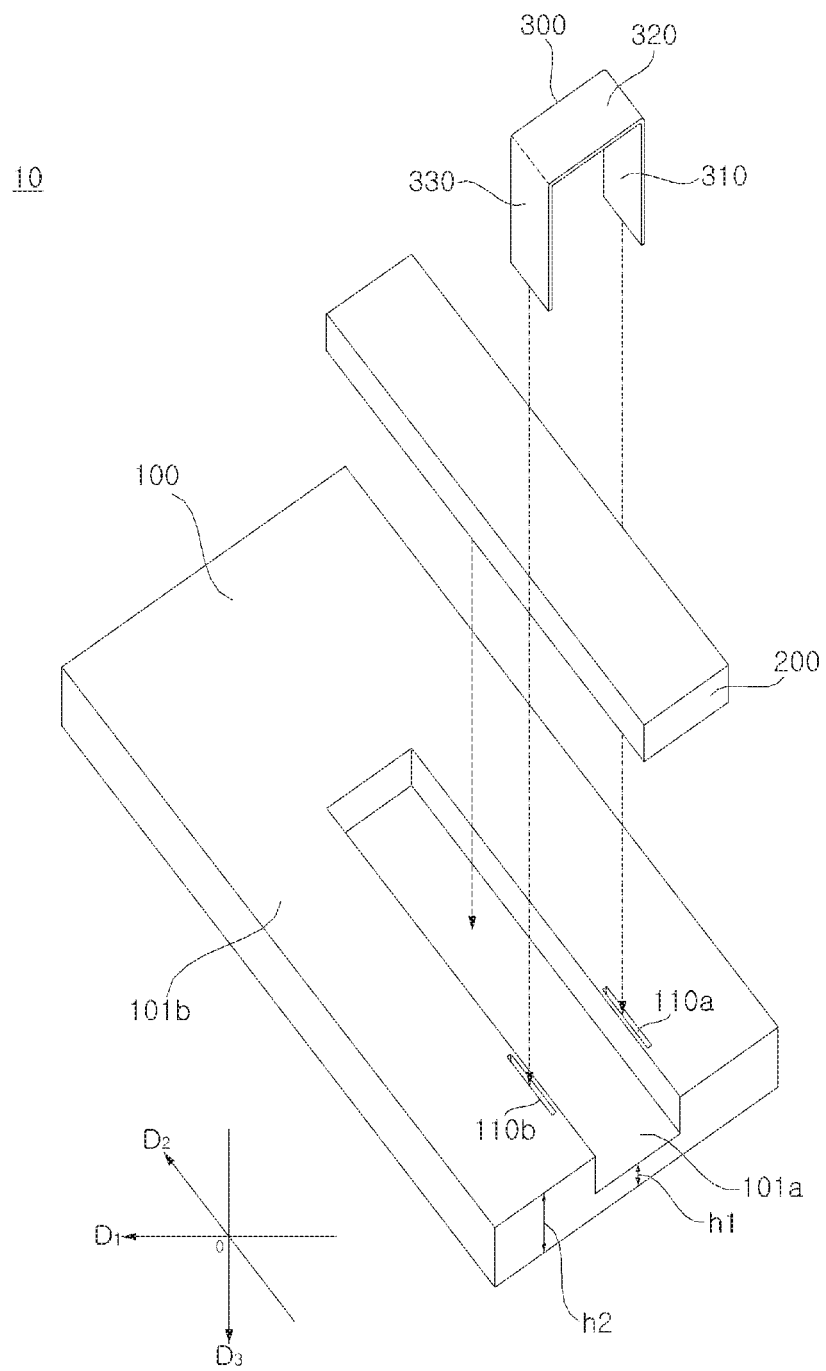
FIG. 1B is an exploded perspective view of the printed circuit board assembly according to the embodiment of the present disclosure, which is viewed in another direction.

FIG. 1A is an exploded perspective view of a printed circuit board assembly according to an embodiment of the present disclosure, which is viewed in one direction. FIG. 1B is an exploded perspective view of the printed circuit board assembly according to the embodiment of the present disclosure, which is viewed in another direction.

Referring to FIGS. 1A and 1B, for example, the printed circuit board 10 may include a printed circuit board 100, a bus bar 200, a shield 300 and a sensor 400.

The thickness of the printed circuit board 100 may differ depending on the region. For example, the thickness h1 between a region 101a on the rear surface and the front surface of the printed circuit board 100 may be smaller than the thickness h2 between the remaining region 101b of the rear surface, excluding the region 101a, and the front surface of the printed circuit board 100. Here, the thickness h1 between the region 101a of the rear surface and the front surface of the printed circuit board 100 may be set based on the maximum value of current flowing through the bus bar 200.

For example, the printed circuit board 100 may include a plurality of through holes 110a and 110b, which are formed through the printed circuit board 100 from the front surface to the rear surface thereof.

For example, an insulation layer may be disposed between the front surface and the rear surface of the printed circuit board 100.

For example, the bus bar 200 may be a conductor through which current is capable of flowing and may be made of copper, aluminum or the like. Although the bus bar 200 is shown in the drawings as having a rectangular parallelepiped shape, the shape of the bus bar 200 is not limited thereto, and the bus bar 200 may be a conductor having various shapes, such as those of a thick copper wire and a thin elongated plate.

For example, the bus bar 200 may be disposed so as to contact the rear surface of the printed circuit board 100. For example, the bus bar 200 may be disposed so as to contact the region 101a on the rear surface of the printed circuit board 100 that has the smaller thickness.

For example, the bus bar 200 may be attached to the rear surface of the printed circuit board 100. For example, the bus bar 200 may be attached to the rear surface of the printed circuit board 100 through adhesion using an adhesive, a hot pressing using the application of heat and pressure or the like.

For example, the shield 300 may be made of a magnetic body having high permeability. For example, the shield 300 may be made of a rectangular silicon steel plate.

The shield 300 may be configured so as to surround at least a portion of the bus bar 200. For example, the shield 300 may be configured such that the opposite ends of the rectangular plate are bent in one direction such that the bent end parts face each other.

For example, the shield 300 may include a first vertical part 310 including one end, a horizontal part 320, which is bent from the first vertical part 310 and extends therefrom, and a second vertical part 330 including the other end.

Although the drawings illustrate an example in which the first and second vertical parts 310 and 330 of the shield 300 are vertically bent from the horizontal part 320 in the direction of D3 so as to be parallel to and symmetrical with each other, the present disclosure is not limited thereto. For example, the first and second vertical parts 310 and 330 of the shield 300 may be bent from the horizontal part 320 at a predetermined angle and may extend therefrom.

For example, the first and second vertical parts 310 and 330 of the shield 300 may be fitted into respective ones of the plurality of through holes 110*a* and 110*b* formed through the printed circuit board 100. For example, the first and second vertical parts 310 and 330 of the shield 300 may be fitted into respective through holes 110*a* and 110*b* formed through the printed circuit board 100 in the direction of D3 toward the front surface from the rear surface of the printed circuit board 100 so as to surround at least a portion of the bus bar 200.

For example, the first and second vertical parts 310 and 330 of the shield 300 may be fitted into respective ones of the plurality of through holes 110*a* and 110*b* so as to project a predetermined height from the front surface of the printed circuit board 100 in the direction of D3. For example, the height that the portions of the first and second vertical parts 310 and 330 of the shield 300 project from the front surface of the printed circuit board 100 may be equal to or greater than the height of the sensor 400.

For example, the shield 300 may be disposed so as to be in contact with at least a portion of the bus bar 200. For example, the horizontal part 320 of the shield 300 may be in contact with the rear surface of the bus bar 200. For example, the first and second vertical parts 310 and 330 of the shield 300 may be in contact with the lateral sides of the bus bar 200.

For example, the sensor 400 may be a magnetic sensor for detecting a magnetic field. For example, the sensor 400 may be a hall sensor using a hall effect. Here, the hall effect refers to a physical phenomenon in which potential difference occurs between the opposite ends of a conductor when a magnetic field intersects the conductor through which current flows. When the sensor 400 is a hall sensor, it is possible to detect the current flowing through the bus bar 200 based on the potential difference between the opposite ends of a conductor.

Although the sensor 400 is described as being a hall sensor in this embodiment, the present disclosure is not limited thereto. The sensor 400 may also be a circuit element, such as a magneto-resistor and a magnetic transistor including a magnetic sensor having an amplification function.

For example, the sensor 400 may be mounted on the front surface of the printed circuit board 100.

For example, the magnetic field, which is induced by the current flowing through the bus bar 200, may be concentrated into the internal space between the first and second vertical parts 310 and 330 of the shield 300 by the shield 300. Here, the sensor 400 may be disposed in the internal space between the first and second vertical parts 310 and 330 of the shield 300, in which the magnetic field is concentrated. For example, the magnetic field induced outside the shield 300 may be blocked by the shield 300.

For example, the length of the sensor 400 in the direction of D2 may be equal to or smaller than the length of the first and second vertical parts 310 and 320 in the direction of D2. For example, the area of the flat surface of the sensor 400 may be equal to or smaller than the area of the flat surface of the horizontal part 3210 of the shield 300.

For example, the printed circuit board assembly 10 may further include a holding member (not shown) for preventing the shield 300 from being spaced apart from the bus bar 200. For example, the holding member may be disposed on the rear surface of the horizontal part 320 of the shield 300 in the state of being in contact therewith.

In order to prevent the shield 300 from being spaced apart from the bus bar 200, the shield 300 may be attached to the bus bar 200. For example, the horizontal part 310 of the shield 300 may be attached to the rear surface of the bus bar 200 using adhesion or the like.

Figure 2:
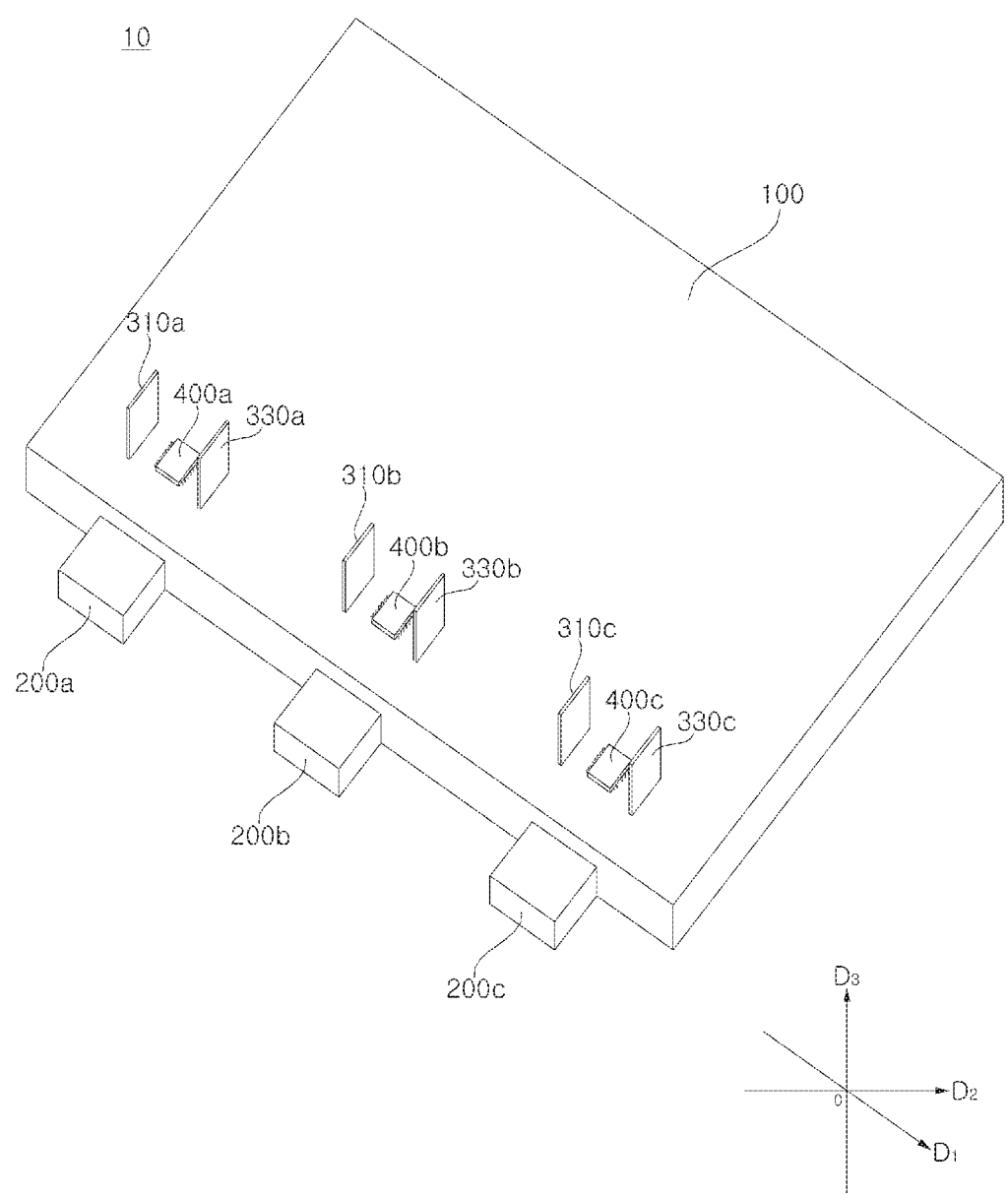
FIG. 2 is a perspective view of a printed circuit board assembly according to an embodiment of the present disclosure, which is viewed in one direction.

FIG. 2 is a perspective view of a printed circuit board assembly according to an embodiment of the present disclosure, which is viewed in one direction.

Referring to FIG. 2, for example, the printed circuit board assembly 10 may include a plurality of bus bars 200*a*, 200*b* and 200*c*, a plurality of shields 300*a*, 300*b* and 300*c* and a plurality of sensors 400*a*, 400*b* and 400*c*.

For example, the printed circuit board 100 may include a plurality of through holes (e.g., the through holes 110*a* and 110*b* in FIG. 1A), which are formed therethrough from the front surface to the rear surface thereof. For example, the printed circuit board 100 may include a plurality of through holes, the number of which corresponds to the number of the plurality of bus bars 200*a*, 200*b* and 200*c*, the plurality of shields 300*a*, 300*b* and 300*c* and the plurality of sensors 400*a*, 400*b* and 400*c*.

For example, the plurality of bus bars 200*a*, 200*b* and 200*c* may be insulated from each other by means of the printed circuit board 100. Insulating members (not shown) may be disposed between the plurality of bus bars 200*a*, 200*b* and 200*c*, which are exposed through the printed circuit board 100 to the outside, in order to insulate the plurality of bus bars 200*a*, 200*b* and 200*c* from each other.

For example, the plurality of shields 300*a*, 300*b* and 300*c* may be fitted into respective ones of the plurality of through holes formed through the printed circuit board 100 and may project a predetermined height from the front surface of the printed circuit board 100 in the direction of D3.

For example, each of the plurality of shields 300*a*, 300*b* and 300*c* enables a magnetic field induced by the current flowing through a corresponding one of the plurality of bus bars 200*a*, 200*b* and 200*c*, to be concentrated in the internal space thereof. For example, a magnetic field induced by the current flowing through the first bus bar 200*a*, may be concentrated in the internal space between the first and second vertical parts 310*a* and 330*a* of the first shield 300*a*. In contrast, for example, magnetic fields induced by the current flowing through the second and third bus bars 200*b* and 200*c* may be shielded by the first shield 300*a*.

The plurality of sensors 400*a*, 400*b* and 400*c* may be mounted on the front surface of the printed circuit board 100 so as to respectively correspond to the plurality of bus bars 200*a*, 200*b* and 200*c* and the plurality of shields 300*a*, 300*b* and 300*c* and so as to respectively detect the magnetic fields induced by the current flowing through the plurality of bus bars 200*a*, 200*b* and 200*c*.

The printed circuit board assembly 10 may further include the holding members (not shown) configured to prevent the plurality of shields 300*a*, 300*b* and 300*c* from being spaced apart from the plurality of bus bars 200*a*, 200*b* and 200*c*. Here, the printed circuit board assembly 10 may include a plurality of holding members, which are configured respectively to prevent separation of the first shield 300a from the first bus bar 200a, separation of the second shield 300b from the second bus bar 200b and separation of the third shield 300c from the third bus bar 200c, or may include a single holding member, which is configured to collectively prevent the plurality of shields 300a, 300b and 300c from being spaced apart from the plurality of bus bars 200a, 200b and 200c.

Figure 3A:
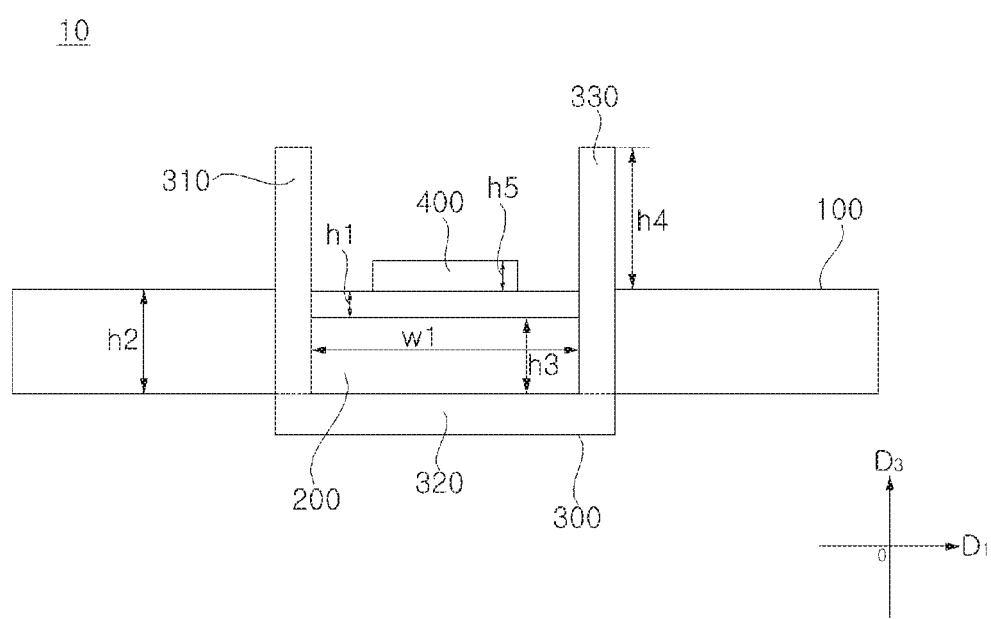
FIGS. 3A and 3B are front cross-sectional views of the printed circuit board assembly according to the embodiment of the present disclosure.
Figure 3B:
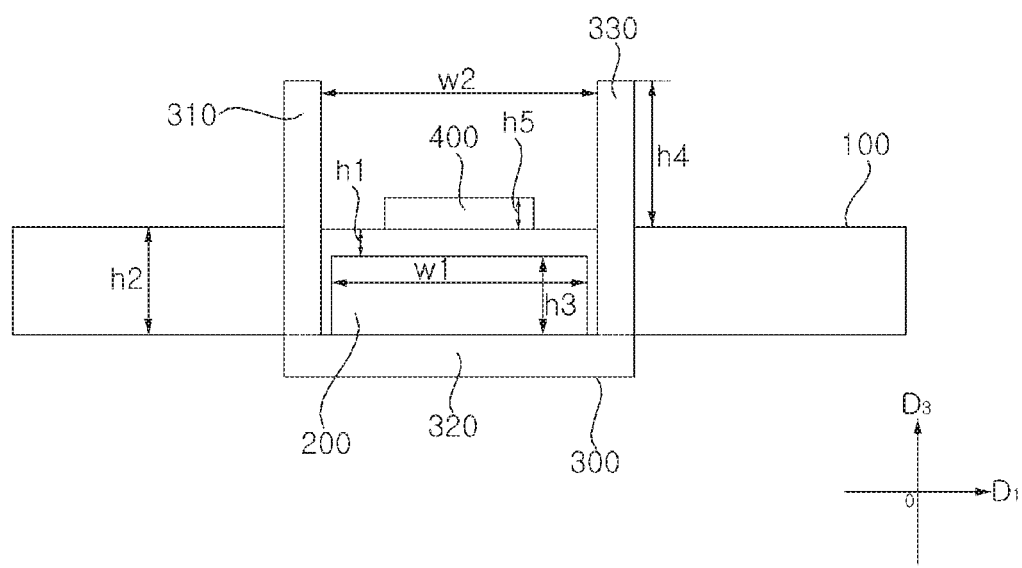

FIGS. 3A and 3B are front cross-sectional views of the printed circuit board assembly according to the embodiment of the present disclosure.

Referring to FIG. 3A, the thickness hl between the region on the rear surface of the printed circuit board 100 that is in contact with the bus bar 200 and the front surface of the printed circuit board 100 may be smaller than the thickness h2 between the remaining region of the rear surface of the printed circuit board 100 that is not in contact with the bus bar 200 and the front surface of the printed circuit board 100.

The height h3 of the bus bar 200 in the direction of D3 may be the difference (h2−h1) between the thickness h1 between the region of the rear surface of the printed circuit board 100 that is in contact with the bus bar 200 and the front surface of the printed circuit board 100 and the thickness h2 between the remaining region of the rear surface of the printed circuit board 100 that is not in contact with the bus bar 200 and the front surface of the printed circuit board 100.

The front surface of the bus bar 200 may be attached to the printed circuit board 100 by means of, for example, adhesion, hot pressing or the like.

The shield 300 may be disposed so as to be in contact with, for example, at least a portion of the bus bar 200. For example, the horizontal part 320 of the shield 300 may be in contact with the rear surface of the bus bar 200, and the first and second vertical parts 310 and 330 of the shield 300 may be in contact with the lateral sides of the bus bar 200.

Here, the width w1 of the bus bar 200 in the direction of D1 may be the distance between the first vertical parts 310 and 330.

The first and second vertical parts 310 and 330 of the shield 300 may be fitted into respective ones of the plurality of through holes formed through the printed circuit board 100 and may be exposed through the front surface of the printed circuit board 100. For example, the height h4 of the portions of the first and second vertical parts 310 and 330 of the shield 300 that project from the front surface of the printed circuit board 100 may be equal to or greater than the height h5 of the sensor 400.

Referring to FIG. 3B, the front surface and the lateral sides of the bus bar 200 may be in contact with the printed circuit board 100, and the rear surface of the bus bar 200 may be in contact with the horizontal part 320 of the shield 300.

In this case, the width w1 of the bus bar 200 in the direction of D1 may be smaller than the distance w2 between the first and second vertical parts 310 and 330 of the shield 300.

The front surface of the lateral sides of the bus bar 200 may be attached to the printed circuit board 100 by means of, for example, adhesion, hot pressing or the like.

Figure 4A:
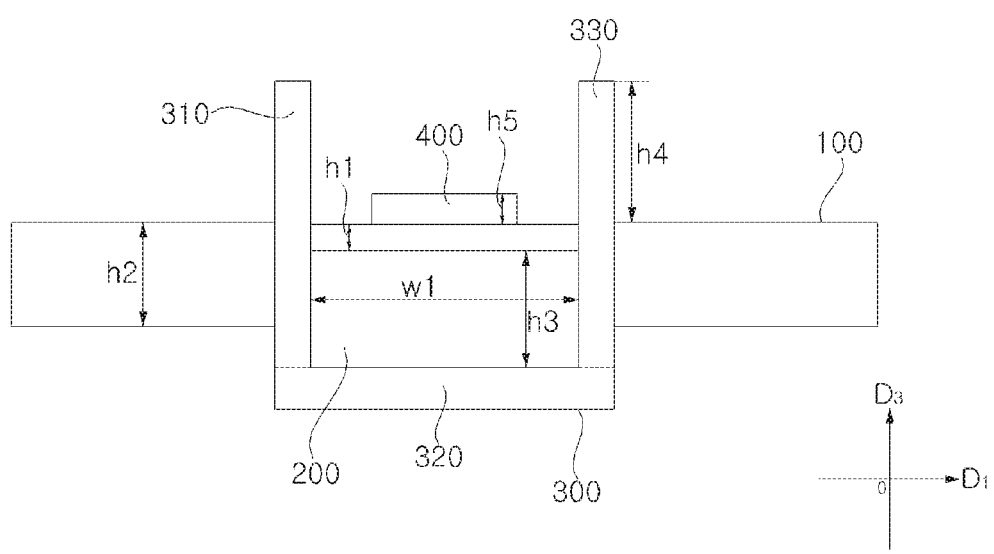
FIGS. 4A and 4B are front cross-sectional views of the printed circuit board assembly according to the embodiment of the present disclosure.
Figure 4B:
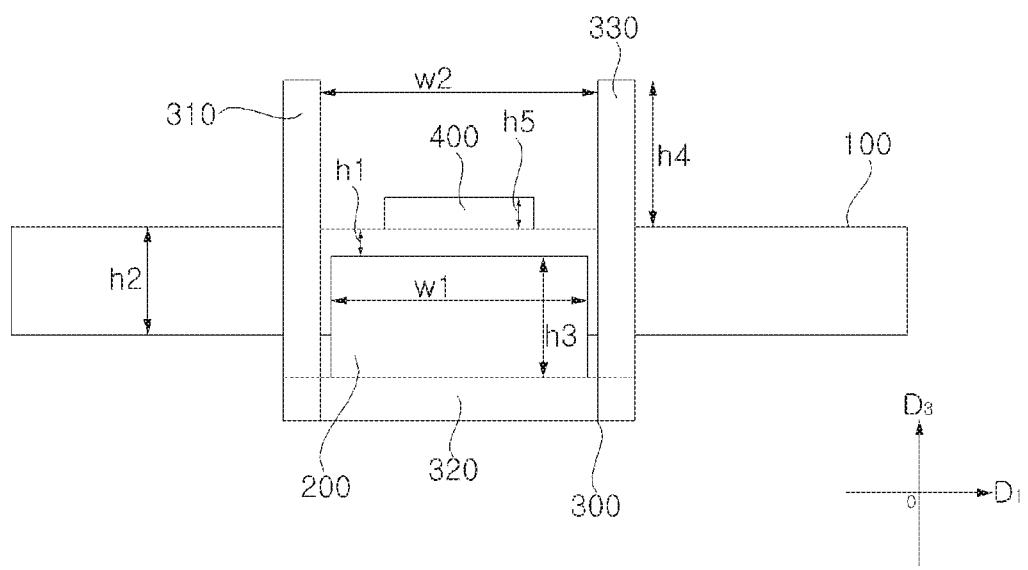

FIGS. 4A and 4B are front cross-sectional views of the printed circuit board assembly according to the embodiment of the present disclosure.

Referring to FIG. 4A, the thickness h1 between the region of the rear surface of the printed circuit board 100 that is in contact with the front surface of the bus bar 200 and the front surface of the printed circuit board 100 may be smaller than the height h2 between the remaining region of the rear surface of the printed circuit board 100 that is not in contact with the front surface of the bus bar 200 and the front surface of the printed circuit board 100.

The height h3 of the bus bar 200 in the direction of D3 may be greater than the difference (h2−h1) between the thickness h1 between the region of the rear surface of the printed circuit board 100 that is in contact with the bus bar 200 and the front surface of the printed circuit board 100 and the thickness h2 between the remaining region of the rear surface of the printed circuit board 100 that is not in contact with the bus bar 200 and the front surface of the printed circuit board 100.

Here, the first and second vertical parts 310 and 330 of the shield 300 may be exposed through the rear surface of the printed circuit board 100.

The front surface of the bus bar 200 may be attached to the printed circuit board 100 by means of adhesion, hot pressing or the like.

For example, the shield 300 may be disposed so as to be in contact with at least a portion of the bus bar 200. For example, the horizontal part 320 of the shield 300 may be in contact with the rear surface of the bus bar 200, and the first and second vertical parts 310 and 330 of the shield 300 may be in contact with the lateral sides of the bus bar 200.

Here, the width w1 of the bus bar 200 in the direction of D1 may be equal to the distance between the first and second vertical parts 310 and 330 of the shield 300.

For example, the first and second vertical parts 310 and 330 of the shield 300 may be fitted into respective ones of the plurality of through holes formed through the printed circuit board 100 and may be exposed through the front surface of the printed circuit board 100. For example, the height h4 of the portions of the first and second vertical parts 310 and 330 that project from the front surface of the printed circuit board 100 may be equal to or greater than the height h5 of the sensor 400.

Referring to FIG. 4B, the front surface and the lateral sides of the bus bar 200 may be in contact with the printed circuit board 100, and the rear surface of the bus bar 200 may be in contact with the horizontal part 320 of the shield 300.

Here, the width w1 of the bus bar 200 in the direction of D1 may be smaller than the distance w2 between the first and second vertical parts 310 and 330 of the shield 300. Air gaps may be present between the regions of the bus bar 200 that are not in contact with the printed circuit board 100 and the first and second vertical parts 310 and 330 of the shield 300.

The front surface and the lateral sides of the bus bar 200 may be partially attached to the printed circuit board 100 by means of, for example, adhesion, hot pressing or the like.

Figure 5A:
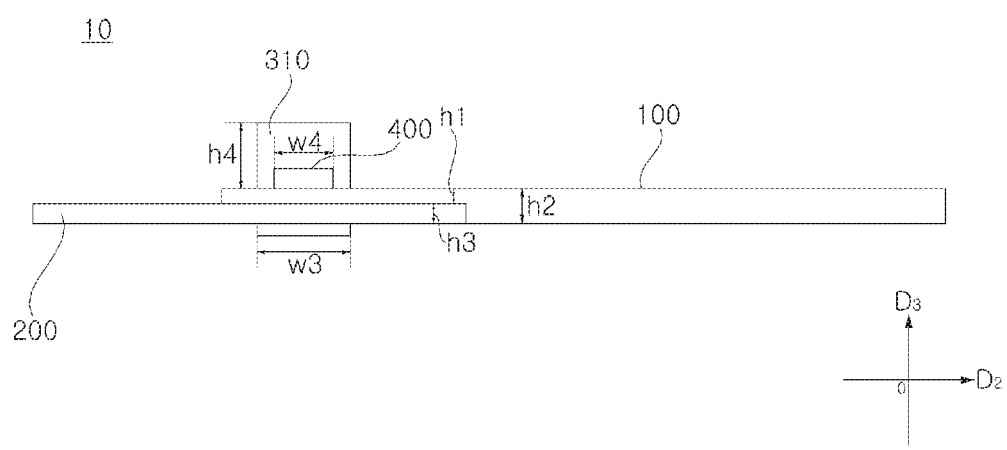
FIGS. 5A and 5B are side cross-sectional views of the printed circuit board assembly according to the embodiment of the present disclosure.
Figure 5B:
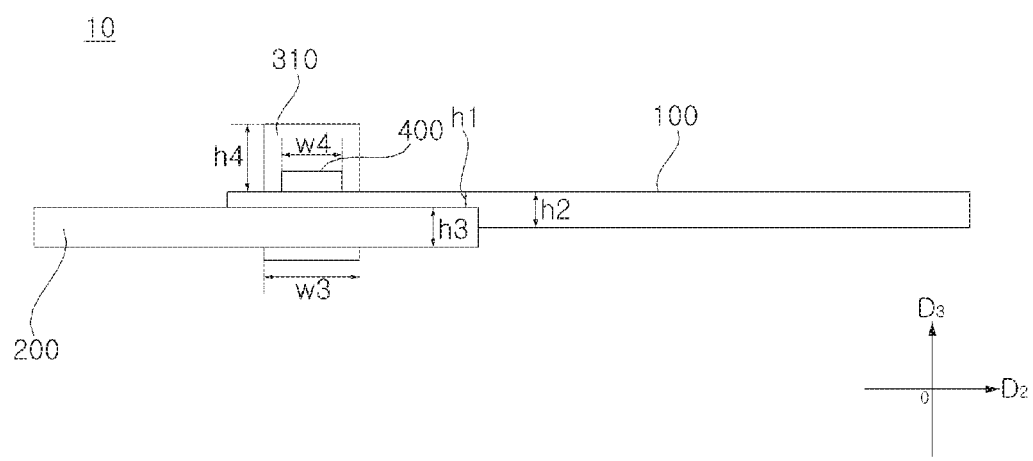

FIGS. 5A and 5B are side cross-sectional views of the printed circuit board assembly according to the embodiment of the present disclosure.

Referring to FIG. 5A, the thickness hl between the region of the rear surface of the printed circuit board 100 that is in contact with the front surface of the bus bar 200 and the front surface of the printed circuit board 100 may be smaller than the thickness h2 between the remaining region of the rear surface of the printed circuit board 100 that is not in contact with the bus bar 200 and the front surface of the printed circuit board 100.

For example, the height h3 of the bus bar 200 in the direction of D3 may be the difference (h2−h1) between the thickness h1 between the region of the rear surface of the printed circuit board 100 that is in contact with the bus bar 200 and the front surface of the printed circuit board 100 and the thickness h2 between the remaining region of the rear surface of the printed circuit board 100 that is not in contact with the bus bar 200 and the front surface of the printed circuit board 100.

For example, the length w4 of the sensor 400 in the direction of D2 may be equal to or smaller than the length w3 of the first vertical part 310 in the direction of D2.

Referring to FIG. 5B, for example, the height h3 of the bus bar 200 in the direction of D3 may be equal to or greater than the difference (h2–h1) between the thickness h1 between the region of the rear surface of the printed circuit board 100 that is in contact with the bus bar 200 and the thickness h2 between the remaining region of the rear surface of the printed circuit board 100 that is not in contact with the bus bar 200.

According to various embodiments of the present disclosure, since the sensor 400 is mounted on one surface of the printed circuit board 100, the bus bar 200 is in contact with the other surface of the printed circuit board 100 and the thickness of the portion of the printed circuit board 100 that is in contact with the bus bar 200 is smaller than the thickness of the remaining portion of the printed circuit board 100, the printed circuit board 100 and the bus bar 200 are able to be secured to each other and to vibrate together with each other. Accordingly, even when a device provided with the printed circuit board assembly 10 is subjected to vibration, it is possible to detect, without variation, a magnetic field induced by the current flowing through the bus bar 200, and it is possible to precisely measure the current flowing through the bus bar 200.

Figure 6A:
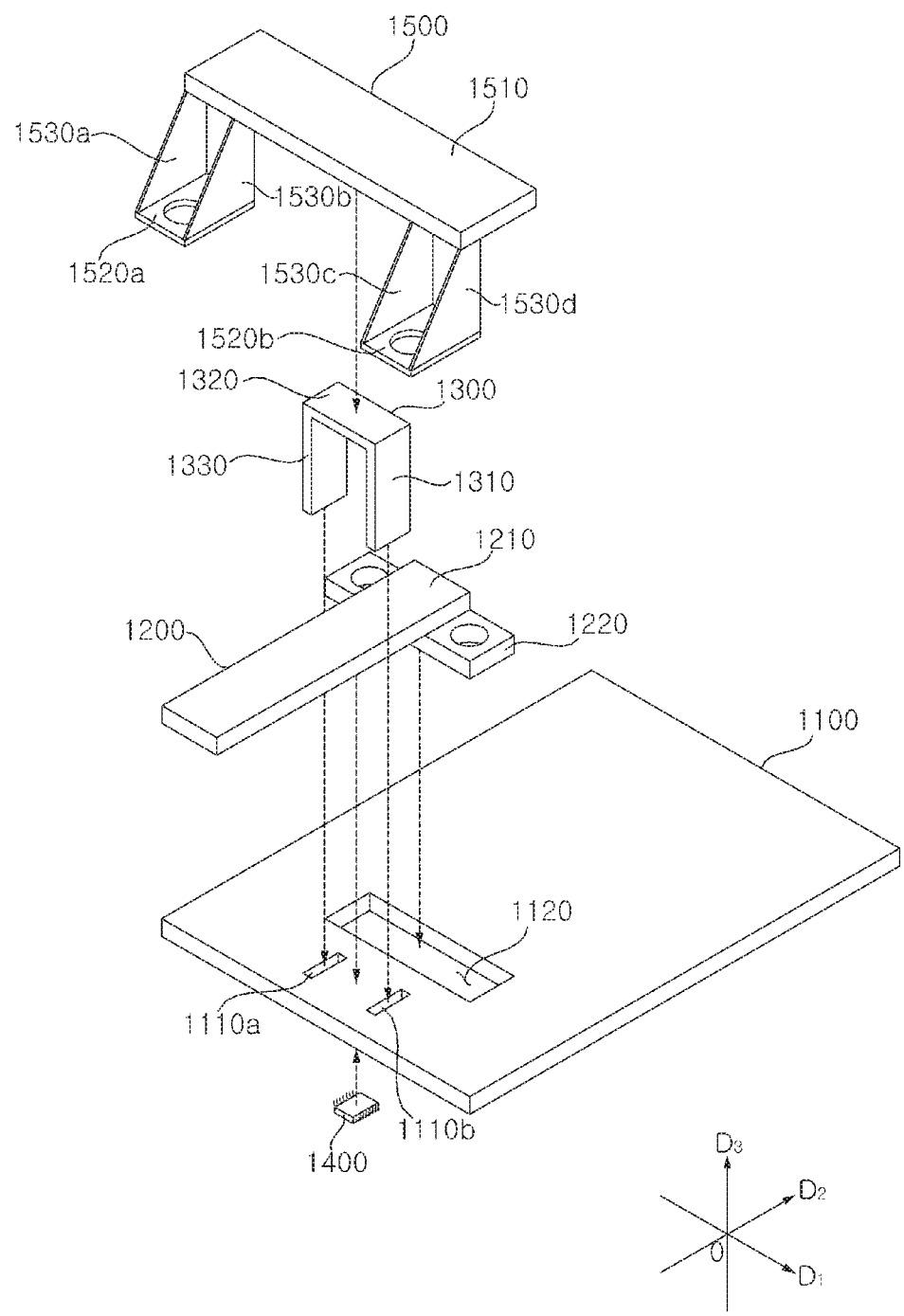
FIG. 6A is an exploded perspective view of a printed circuit board assembly according to an embodiment of the present disclosure, which is viewed in one direction.
Figure 6B:
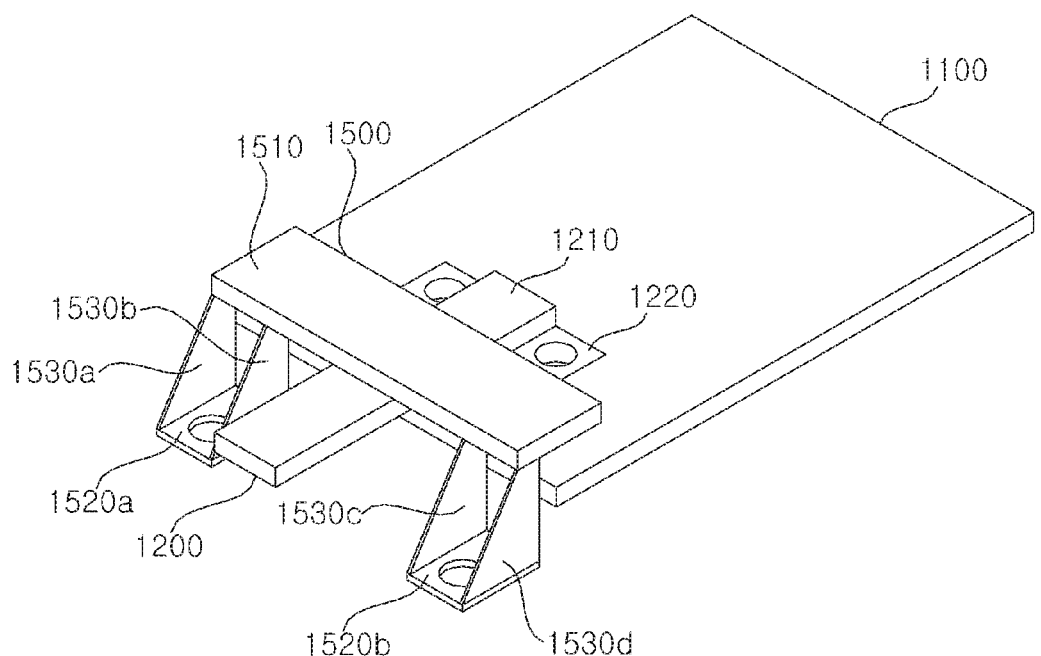
FIG. 6B is a perspective view of the printed circuit board assembly according to the embodiment of the present disclosure, which is viewed in one direction.
Figure 6B:
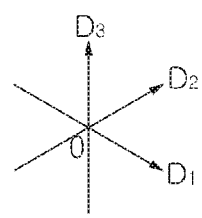

FIG. 6A is an exploded perspective view of a printed circuit board assembly according to an embodiment of the present disclosure, which is viewed in one direction. FIG. 6B is a perspective view of the printed circuit board assembly according to the embodiment of the present disclosure, which is viewed in one direction.

Referring to FIGS. 6A and 6B, for example, the printed circuit board assembly 10 may include a printed circuit board 1100, a bus bar 1200, a shield 1300, a sensor 1400 and/or a holding member 1500.

For example, the printed circuit board 100 may include a plurality of through holes 1110a, 1110b and 1120, which are formed through the printed circuit board 100 from the front surface to the rear surface thereof. Although the printed circuit board 1100 is illustrated in the drawings as including a plurality of first through holes 1110a and 1110b, into which the shield 1300 is fitted, and a second through hole 1120, into which the bus bar 1200 is fitted, the present disclosure is not limited thereto.

For example, an insulating layer may be disposed between the front surface and the rear surface of the printed circuit board 1100.

For example, the bus bar 1200 may be a conductor, which allows current to flow therethrough, and may be made of copper, aluminum or the like.

The bus bar 1200 may be disposed so as to contact the front surface of the printed circuit board 1100. For example, the bus bar 1200 may be disposed so as to contact the region of the front surface of the printed circuit board 1100 between the plurality of through holes 1110a and 1110b, into which the shield 1300 is fitted.

For example, the bus bar 1200 may include a longitudinal part 1210 and a connection part 1220. The longitudinal part 1210 may be disposed so as to contact at the rear surface thereof the front surface of the printed circuit board 1100, and the connection part 1220 may be fitted into the second through hole 1120 in the printed circuit board 1100.

For example, the connection part 1220 may have formed therein at least one through hole, and may be secured to other components by means of fastening elements such as a bolt and a nut.

Although each of the longitudinal part 1210 and the connection part 1220 of the bus bar 1200 is illustrated in the drawing as having a rectangular parallelepiped shape, the shape of the bus bar 1200 is not limited thereto. The bus bar 1200 may be made of a thick wire, an elongated thin plate or the like, and may have various shapes.

For example, the bus bar 1200 may be attached to the front surface of the printed circuit board 1100. For example, the bus bar 1200 may be attached to the front surface of the printed circuit board 1100 through adhesion using an adhesive, hot pressing using application of heat and pressure, or the like.

For example, the shield 1300 may be made of a magnetic body having a high permeability. For example, the shield 1300 may be made of a rectangular silicon steel plate.

The shield 1300 may be configured so as to surround at least a portion of the bus bar 1200. For example, the shield 1300 may be configured so as to surround at least a portion of the longitudinal part 1210 of the bus bar 1200.

The shield 1300 may be configured such that the opposite ends of the rectangular plate member are bent and extend so as to face each other.

For example, the shield 1300 may include a first vertical part 1310 including one end thereof, a horizontal part 1320, which is bent from the first vertical part 1310 and extends, and a second vertical part 1330 including the other end thereof, which is bent from the horizontal part 1320 and extends.

Although the first and second vertical parts 1310 and 1330 of the shield 1300 are illustrated in the drawings as being bent vertically from the horizontal part 1320 so as be symmetrical to and parallel to each other, the present disclosure is not limited thereto. For example, the first and second vertical parts 1310 and 1330 of the shield 1300 may each be configured so as to be bent from the horizontal part 1320 at a predetermined angle and to extend therefrom.

For example, the first and second vertical parts 1310 and 1330 of the shield 1300 may be fitted into respective ones of the plurality of through holes 1110a and 1110b formed through the printed circuit board 1100. For example, the first and second plurality of through holes 1110a and 1110b formed through the printed circuit board 1100, in the direction of −D3 from the front surface to the rear surface of the printed circuit board 1100, so as to surround at least a portion of the longitudinal part 1210 of the bus bar 1200.

For example, the shield 1300 may be disposed so as to contact at least a portion of the bus bar 1200. For example, the horizontal part 1320 of the shield 1300 may contact the longitudinal part 1210 of the bus bar 1200. For example, the first and second parts 1310 and 1330 of the shield 1300 may contact the lateral sides of the longitudinal part 1210 of the bus bar 1200.

For example, the sensor 1400 may be a magnetic sensor for detecting a magnetic field. For example, the sensor 1400 may be a hall sensor using a hall effect. Here, the hall effect refers to a physical phenomenon in which potential difference is formed between the opposite ends of a conductor when a magnetic field intersects the conductor through which current flows. When the sensor 1400 is a hall sensor, it is possible to detect the current flowing through the bus bar 1200 based on the potential difference between the opposite ends of a conductor.

Although the sensor 1400 is described as being a hall sensor in this embodiment, the present disclosure is not limited thereto. The sensor 1400 may also be a circuit element, such as a magneto-resistor or a magnetic transistor including a magnetic sensor having an amplification function.

For example, the sensor 1400 may be mounted on the rear surface of the printed circuit board 1100.

The holding member 1500 may be made of, for example, an insulator. For example, the holding member 1500 may be made of a synthetic resin insulator.

For example, the holding member 1500 may be disposed so as to prevent the shield 1300 from being spaced apart from the bus bar 1200. For example, the holding member 1500 may be disposed so as to contact the shield 1300.

For example, the holding member 1500 may include a holding part 1510, support parts 1530a to 1530d and/or fastening parts 1520a and 1520b.

The holding part 1510 may be disposed so as to contact the shield 1300. For example, the holding part 1510 may be disposed so as to contact the horizontal part 1320 of the shield 1300. Although the holding part 1510 of the holding member 1500 is illustrated in the drawings as having a rectangular parallelepiped shape, the shape of the holding part 1510 is not limited thereto. It is sufficient for the holding part 1510 to have a shape that contacts the shield 1300 and thus prevents the shield 1300 from being spaced apart from the bus bar 1200.

For example, the holding part 1510 may contact at least part of, or all of, the area of the horizontal part 1320 of the shield 1300.

For example, each of the fastening parts 1520a and 1520b may have formed therein at least one through hole, and may be secured to other components by means of fastening elements such as a bolt and a nut.

For example, the support parts 1530a to 1530d may be configured such that first ends thereof are connected to the holding part 1510 and second ends thereof are connected to the fastening parts 1520a and 1520b.

Although the support parts 1520a to 1520d of the holding member 1500 are illustrated in the drawings as being bent vertically from the fastening parts 1520a and 1520b so as to be symmetrical to and parallel to each other, the present disclosure is not limited thereto. For example, the support parts 1530a to 1530d of the holding member 1500 may be bent from the fastening parts 1520a and 1520b at a predetermined angle and may extend therefrom.

The shapes of the fastening parts 1520a and 1520b and the support parts 1530a to 1530d of the holding member 1500 are not limited to those shown in the drawings.

Figure 7A:
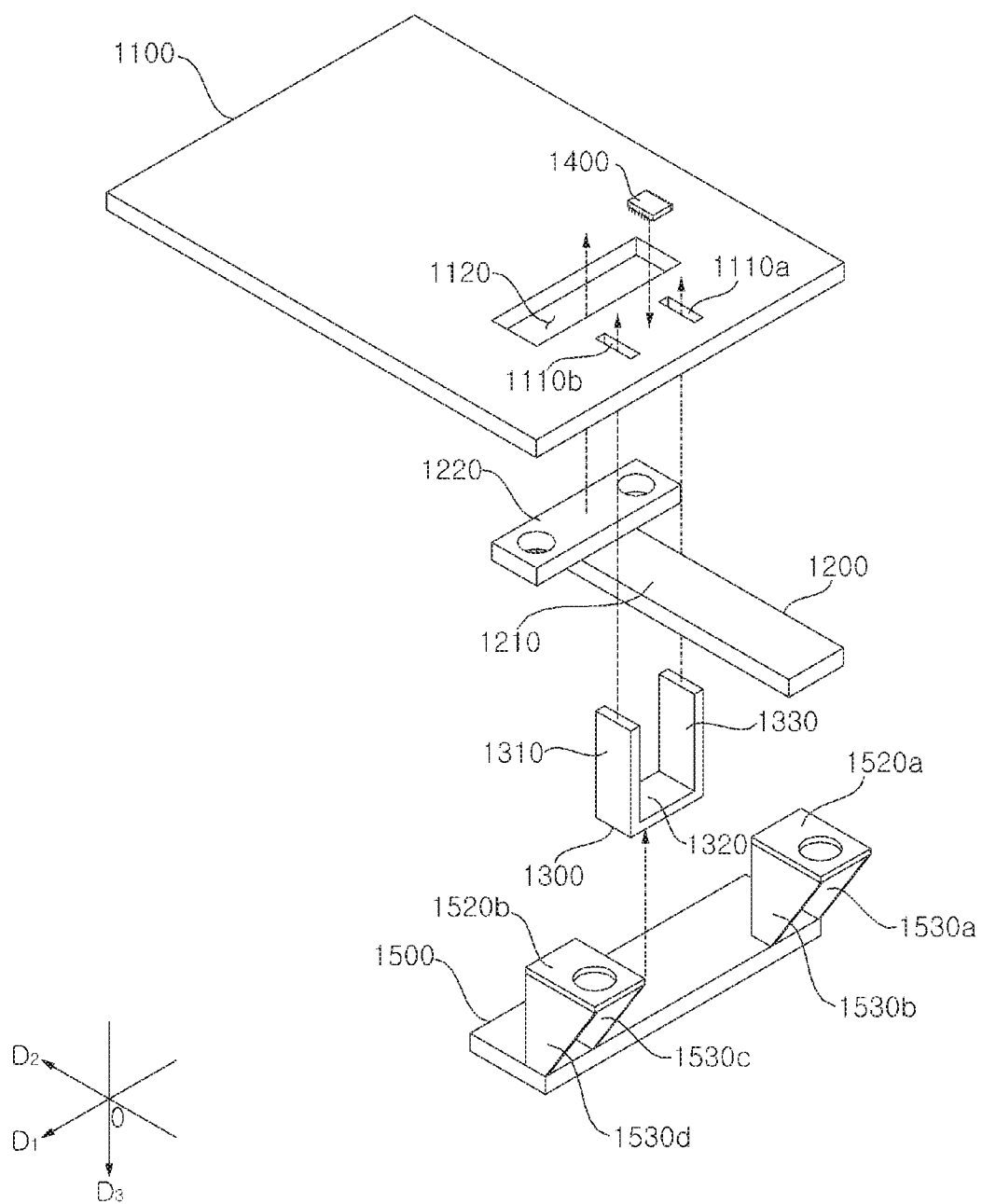
FIG. 7A is an exploded perspective view of the printed circuit board assembly according to the embodiment of the present disclosure, which is viewed in another direction.
Figure 7B:
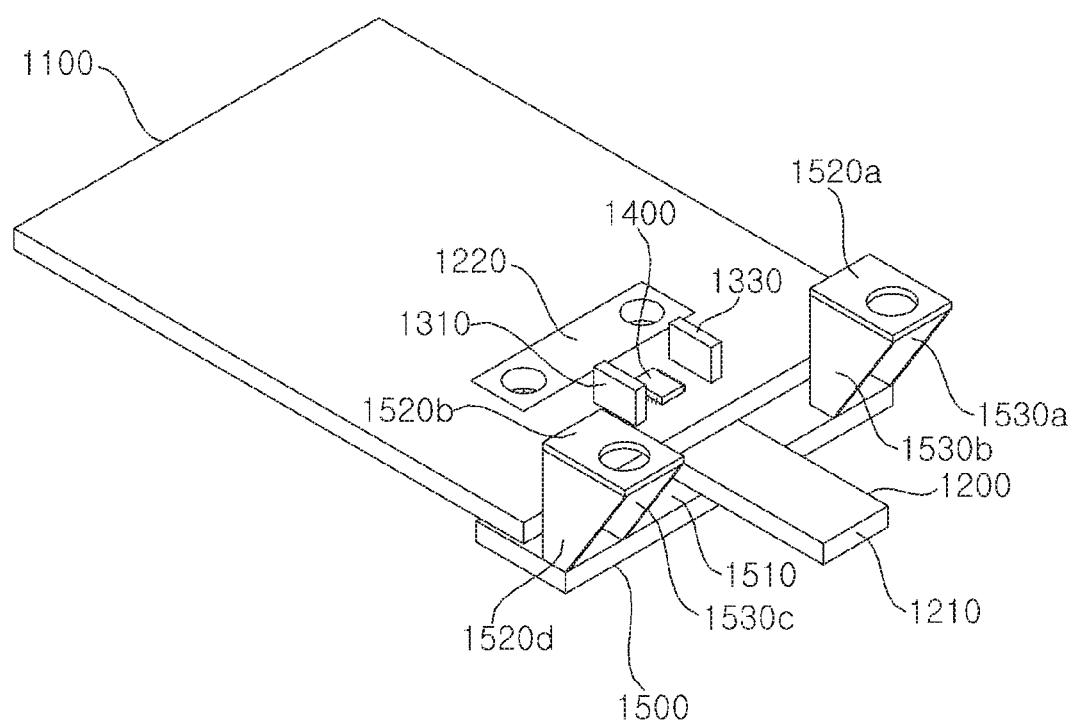
FIG. 7B is a perspective view of the printed circuit board assembly of the embodiment of the present disclosure, which is viewed in another direction.
Figure 7B:
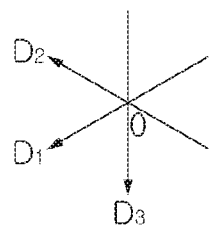

FIG. 7A is an exploded perspective view of the printed circuit board assembly according to the embodiment of the present disclosure, which is viewed in another direction. FIG. 7B is a perspective view of the printed circuit board assembly of the embodiment of the present disclosure, which is viewed in another direction.

Referring to FIGS. 7A and 7B, for example, the connection part 220 of the bus bar 1200 may be fitted into the second through hole 1120 in the printed circuit board 1100, and may be exposed through a region of the rear surface of the printed circuit board 1100.

The connection part 1220, which is exposed through the region of the rear surface of the printed circuit board 1100, may be secured to other components by means of fastening elements such as a bolt and a nut.

For example, the first and second vertical parts 1310 and 1330 of the shield 1300 may be fitted into the plurality of through holes 1110a and 1110b so as to project a predetermined height from the rear surface of the printed circuit board 1100 in the direction of −D3. For example, the height of the portions of the first and second vertical parts 1310 and 1330 of the shield 1300 that project from the rear surface of the printed circuit board 1100 may be equal to or greater than the height of the sensor 1400.

For example, the sensor 1400 may be mounted on the rear surface of the printed circuit board 1100.

For example, the magnetic field induced by the current flowing through the bus bar 1200, may be concentrated in the internal space between the first and second vertical parts 1310 and 1330 of the shield 1300 by means of the shield 1300. Here, the sensor 1400 may be disposed in the internal space between the first and second vertical parts 1310 and 1330 of the shield 1300, to which a magnetic field is concentrated. For example, the magnetic field induced outside the shield 1300 may be shielded by the shield 1300.

The length of the sensor 1400 in the direction of D2 may be equal to or smaller than the length of the first and second vertical parts 1310 and 1330 in the direction of D2. For example, the area of the flat surface of the sensor 1400 may be equal to or smaller than the area of the flat surface of the horizontal part 1320 of the shield 1300.

For example, the height of the support parts 1530a to 1530d in the direction of D3 may be equal to or greater than the sum of the height of the first and second vertical parts 1310 and 1330 of the shield 1300 in the direction of D3 and the height of the holding part 1510 in the direction of D3.

Figure 8A:
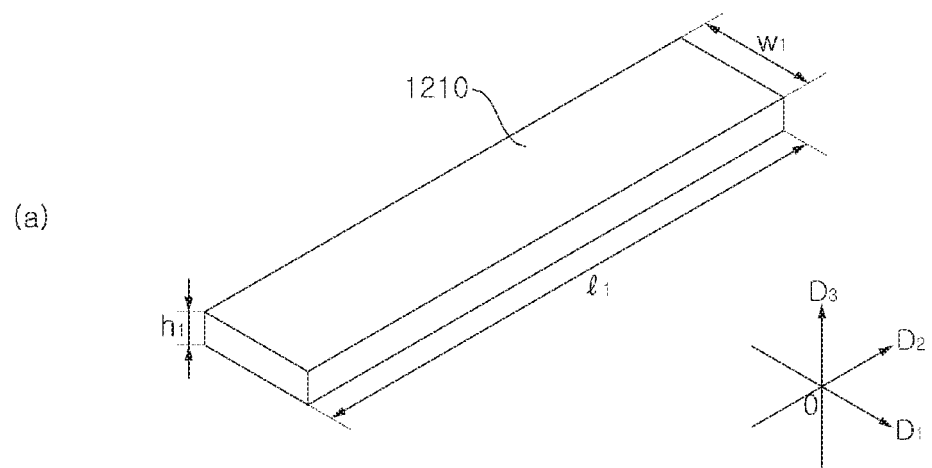
FIG. 8A is a perspective view of a longitudinal part and a connection part of a bus bar according to the embodiment of the present disclosure, which is viewed in one direction.
Figure 8A:
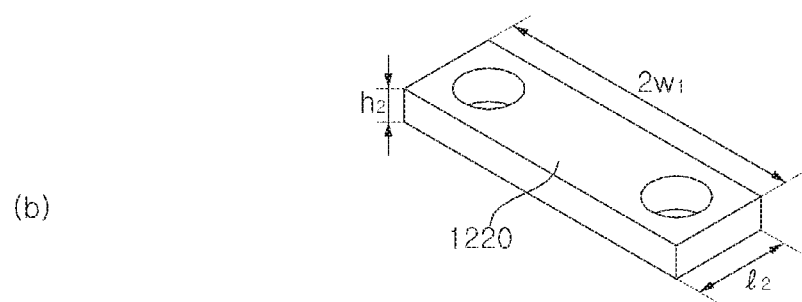
Figure 8A:
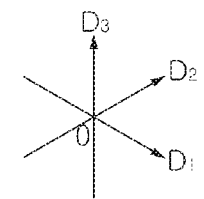
Figure 8B:
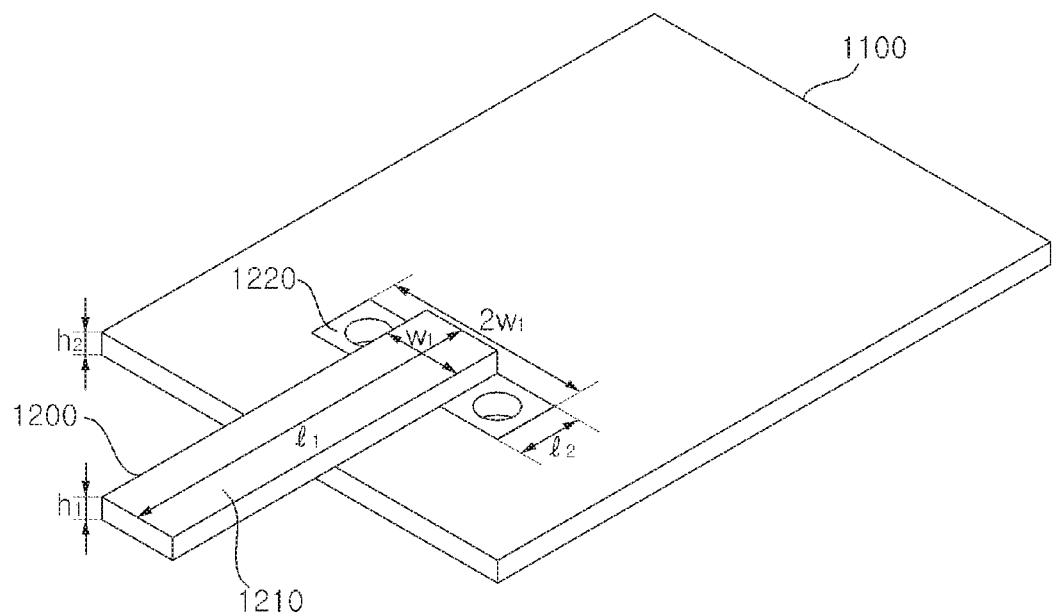
FIG. 8B is a perspective view of the printed circuit board assembly according to the embodiment of the present disclosure, which is viewed in one direction.
Figure 8B:
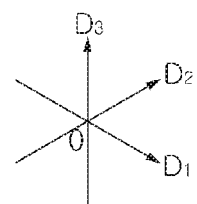

FIG. 8A is a perspective view of the longitudinal part and the connection part of the bus bar according to the embodiment of the present disclosure, which is viewed in one direction. FIG. 8B is a perspective view of the printed circuit board assembly according to the embodiment of the present disclosure, which is viewed in one direction.

Referring to (a) and (b) of FIG. 8A, for example, each of the longitudinal part 1210 and the connection part 1220 of the bus bar 1200 may be made of a conductor having the shape of a rectangular parallelepiped.

For example, the connection part 1220 may have formed therein at least one through hole and may be secured to other components by means of fastening elements such as a bolt and a nut.

For example, the width w1 of the longitudinal part 1210 in the direction of D1 may be smaller than the width 2w1 of the connection part 1220 in the direction of D1, and the length l1 of the longitudinal part 1210 in the direction of D2 may be greater than the length l2 of the connection part 1220 in the direction of D2.

For example, the longitudinal part 1210 of the bus bar 1200 may be disposed such that the rear surface thereof contacts the front surface of the connection part 1220.

The longitudinal part 1210 and the connection part 1220 of the bus bar 1200 may be attached to each other through, for example, adhesion using an adhesive, hot pressing using application of heat and pressure or the like.

Referring to FIG. 8B, the longitudinal part 1210 may be disposed such that the rear surface thereof contacts the front surface of the printed circuit board 1100, and the connection part 1220 may be fitted into the second through hole 1120 in the printed circuit board 1100.

Although the width in the direction of D1 and the length in the direction of D2 of the second through hole 1120 in the printed circuit board 1100 and the height in the direction of D3 of the printed circuit board 1100 are illustrated in the drawings as respectively coinciding with the width 2w1 in the direction of D1, the length l2 in the direction of D2 and the height h2 in the direction of D3 of the connection part 1220, the present disclosure is not limited thereto.

For example, the height of the connection part 1220 in the direction of D3 may be greater or smaller than the height h2 of the printed circuit board 1100 in the direction of D3.

Furthermore, although the longitudinal part 1210 and the connection part 1220 of the bus bar 1200 are illustrated in the drawings as being separate from each other, the present disclosure is not limited thereto. The longitudinal part 1210 and the connection part 1220 may be respectively composed of a plurality of conductors, or may be composed of a single conductor such that the bus bar 1200 includes the longitudinal part 1210 and the connection part 1220, which are integrally formed with each other.

Figure 9A:
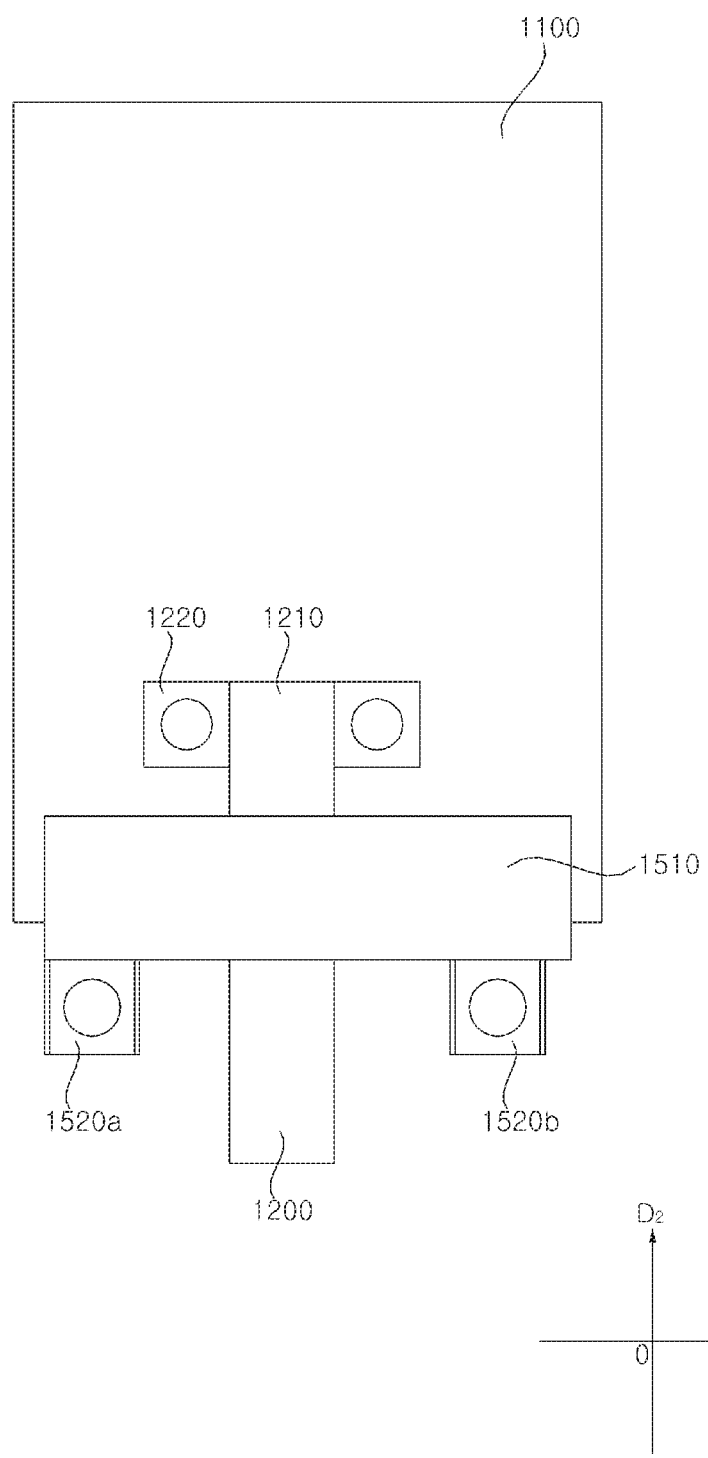
FIG. 9A is a plan view of the printed circuit board according to the embodiment of the present disclosure.
Figure 9B:
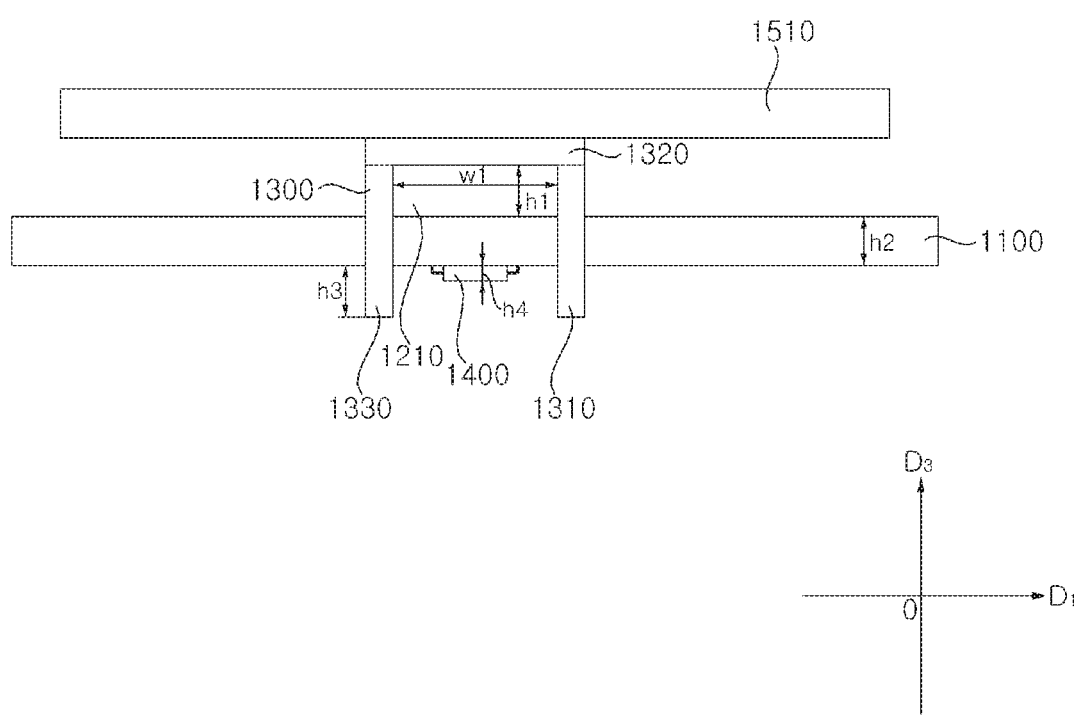
FIG. 9B is a front cross-sectional view of the printed circuit board according to the embodiment of the present disclosure.

FIG. 9A is a plan view of the printed circuit board according to the embodiment of the present disclosure. FIG. 9B is a front cross-sectional view of the printed circuit board according to the embodiment of the present disclosure.

Referring to FIGS. 9A and 9B, for example, the holding part 1510 of the holding member 1500 may be disposed so as to contact the horizontal part 1320 of the shield 1300.

Although the holding part 1510 of the holding member 1500 is illustrated in the drawings as contacting the entire area of the horizontal part 1320 of the shield 1300, the present disclosure is not limited thereto.

The fastening parts 1520a and 1520b of the holding member 1500 may be secured to other components by means of, for example, fastening elements such as a bolt and a nut, which pass through at least one through hole formed therein. Consequently, since the holding part 1510 is not spaced apart from the horizontal part 1320 of the shield 1300, it is possible to prevent the shield 1300 from being spaced apart from the bus bar 1200.

The shield 1300 may be disposed so as to contact at least a portion of the longitudinal part 1210 of the bus bar 1200. For example, the horizontal part 1320 of the shield 1300 may contact the front surface of the longitudinal part 1210 of the bus bar 1200, and the first and second vertical parts 1310 and 1330 of the shield 1300 may contact the lateral sides of the longitudinal part 1210 of the bus bar 1200.

Here, the width w1 of the longitudinal part 1210 of the bus bar 1200 in the direction of D1 may be equal to the distance between the first and second vertical parts 1310 and 1330 of the shield 1300.

For example, the first and second vertical parts 1310 and 1330 of the shield 1300 may be fitted into respective ones of the plurality of through holes in the printed circuit board 1100 and may be exposed through the rear surface of the printed circuit board 1100.

For example, the height of the first and second vertical parts 1310 and 1330 of the shield 1300 in the direction of D3 may be equal to or greater than the sum of the height h1 of the longitudinal part 1210 of the bus bar 1200 in the direction of D3, the height h4 of the printed circuit board 1100 in the direction of D3 and the height h4 of the sensor 1400 in the direction of D3.

The height h3 in the direction of D3 of the portions of the first and second vertical parts 1310 and 1330 of the shield 1300 that project from the rear surface of the printed circuit board 1100 may be equal to or greater than the height h4 of the sensor 1400 in the direction of D3.

According to the various embodiments of the present disclosure, since it is possible to prevent the shield 1300 from being spaced apart from the bus bar 1200 by means of the holding member 1500, it is possible to improve reliability in performance, quality and the like of the printed circuit board assembly 10.

Furthermore, since the bus bar 1200 is secured to the printed circuit board 1100, it is possible to reliably detect a magnetic field even when the printed circuit board 1100 and the bus bar 1200 vibrate, and thus it is possible to precisely measure the current flowing through the bus bar 1200.

In addition, since it is possible to precisely measure the current flowing through the bus bar 1200, a device provided with the printed circuit board assembly 10 is able to more precisely perform a control operation, based on the detected current value.

Furthermore, since the sensor 1400 is disposed on the rear surface of the printed circuit board, the bus bar 1200 and the shield 1300 are disposed on the front surface of the printed circuit board and the holding member 1500 is disposed on the top of the shield 1300, it is possible to easily and conveniently assemble and disassemble the printed circuit board assembly 10.

Figure 10A:
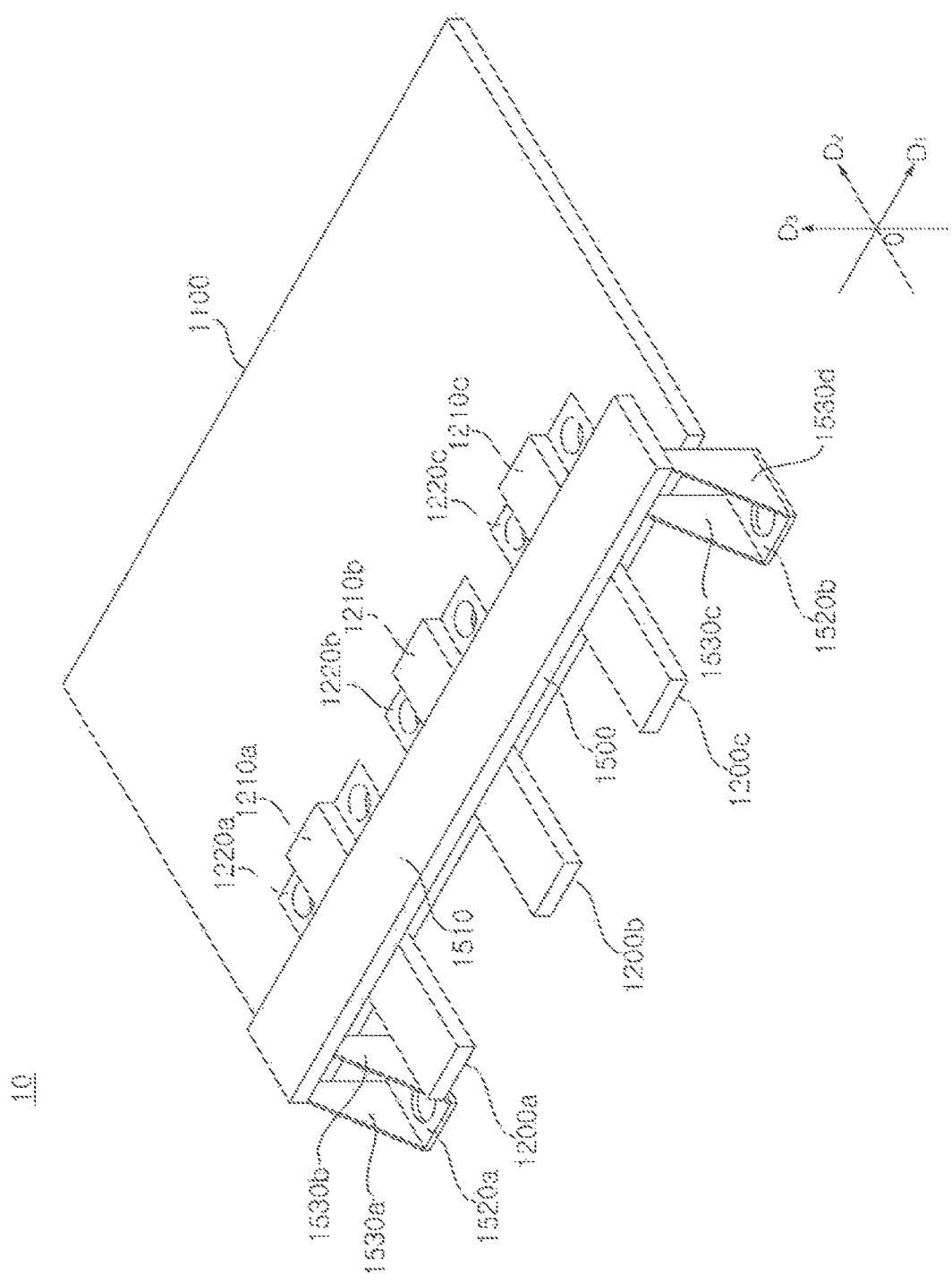
FIG. 10A is a perspective view of a printed circuit board assembly according to an embodiment of the present disclosure on which a plurality of current sensors are mounted, which is viewed in one direction.
Figure 10B:
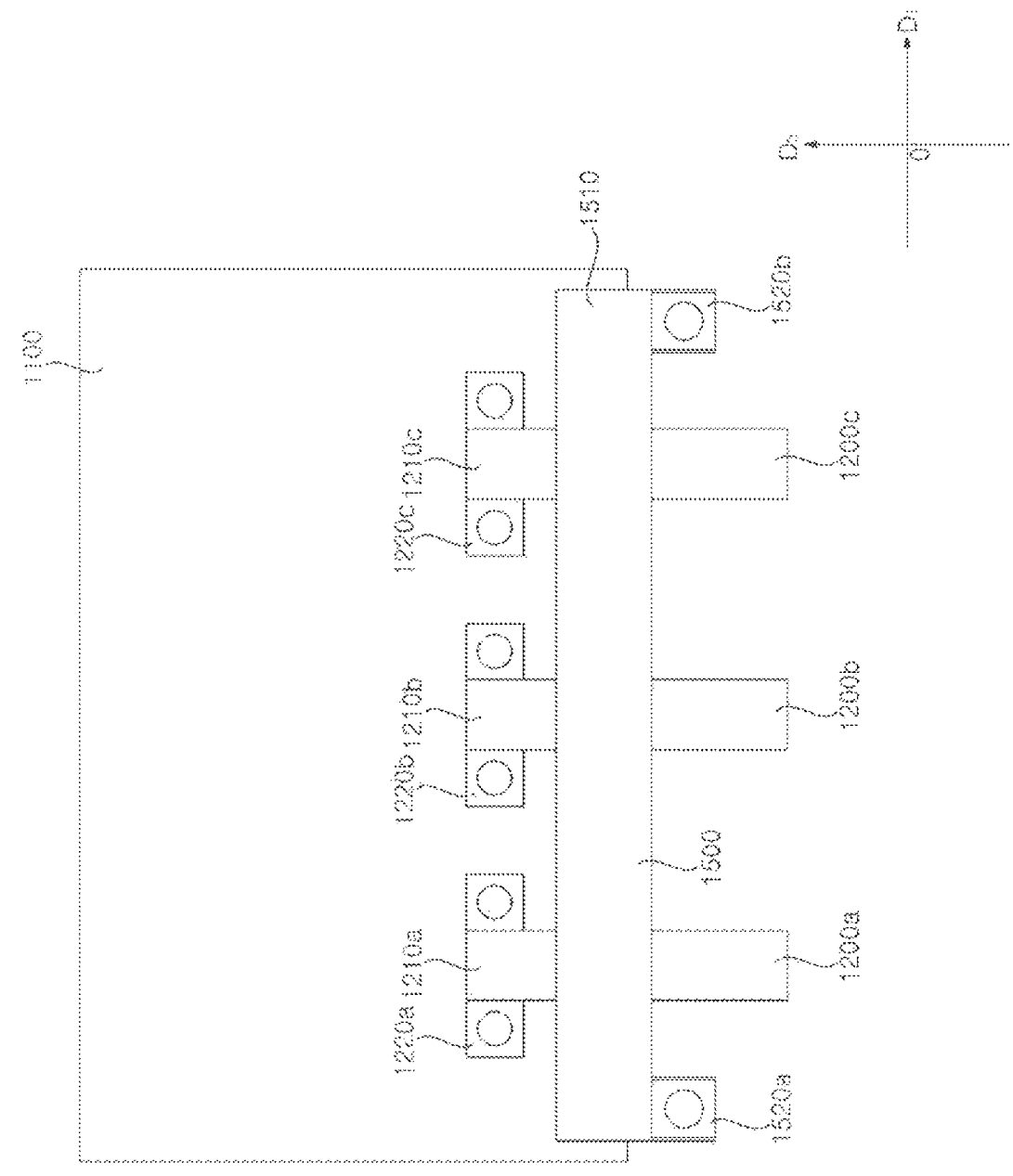
FIG. 10B is a plan view of the printed circuit board assembly according to the embodiment of the present disclosure on which the plurality of current sensors are mounted.
Figure 10C:
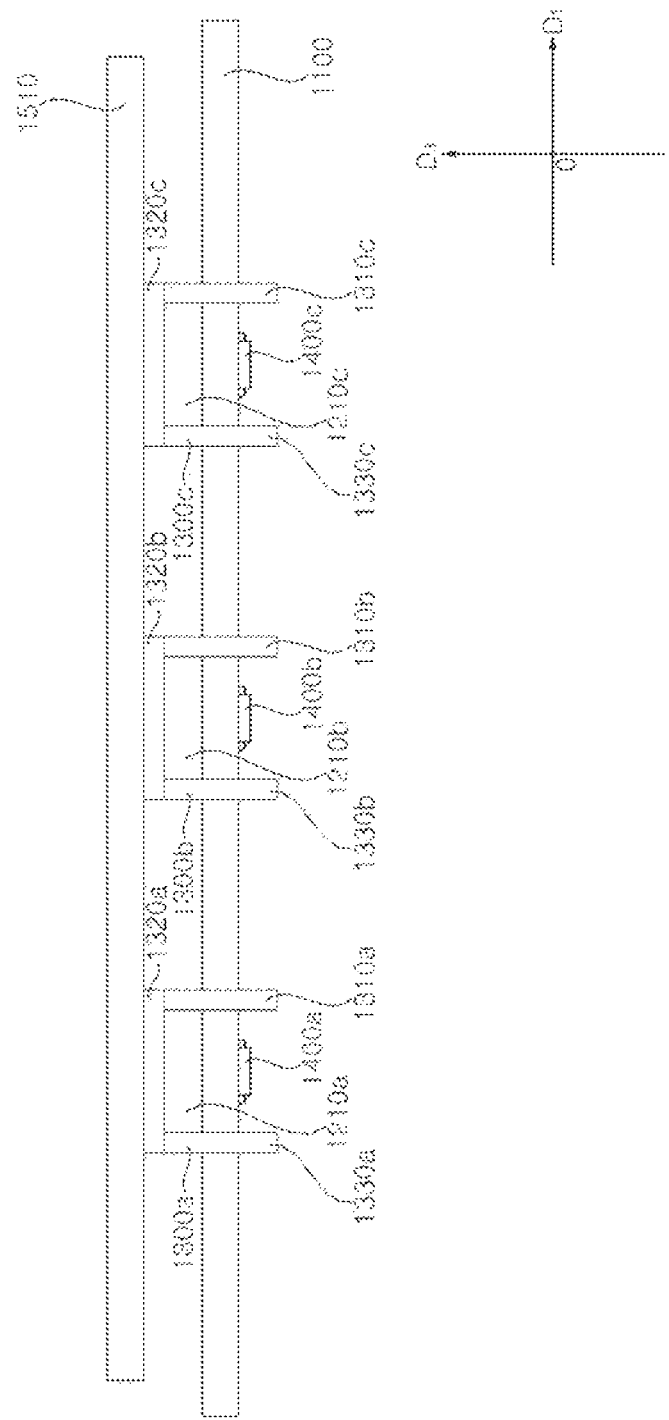
FIG. 10C is a front cross-sectional view of the printed circuit board assembly according to the embodiment of the present disclosure on which the plurality of current sensors are mounted.

FIG. 10A is a perspective view of a printed circuit board assembly according to an embodiment of the present disclosure on which a plurality of current sensors are mounted, which is viewed in one direction. FIG. 10B is a plan view of the printed circuit board assembly according to the embodiment of the present disclosure on which the plurality of current sensors are mounted. FIG. 10C is a front cross-sectional view of the printed circuit board assembly according to the embodiment of the present disclosure on which the plurality of current sensors are mounted.

Referring to FIGS. 10A to 10C, for example, the printed circuit board 10 may include a plurality of bus bars 1200a, 1200b and 1200c, a plurality of shields 1300a, 1300b and 1300c, a plurality of sensors 1400a, 1400b and 1400c and/or a holding member 1500.

For example, the printed circuit board 1100 may include a plurality of first through holes (e.g., the through holes 1110a and 1110b in FIG. 1A), the number of which corresponds to the number of the plurality of shields 1300a, 1300b and 1300c.

For example, the printed circuit board 1100 may include a plurality of second through holes (e.g., the through holes 1120 in FIG. 6A), the number of which corresponds to the number of the plurality of bus bars 1200a, 1200b and 1200c.

For example, the longitudinal parts 1210a, 1210b and 1210c of the plurality of bus bars 1200a, 1200b and 1200c may be disposed on the front surface of the printed circuit board 1100.

The fastening parts 1220a, 1220b and 1220c of the plurality of bus bars 1200a, 1200b and 1200c may be respectively fitted into corresponding ones of the plurality of second through holes in the printed circuit board 1100.

For example, each of the plurality of shields 1300a, 1300b and 1300c may be fitted into a corresponding one of the plurality of first through holes in the printed circuit board 1100 so as to surround at least a portion of a corresponding one of the longitudinal parts 1210a, 1210b and 1210c of the plurality of bus bars 1200a, 1200b and 1200c.

Here, the first vertical parts 1310a, 1310b and 1310c and the second vertical parts 1330a, 1330b and 1330c of the plurality of shields 1300a, 1300b and 1300c may project from the rear surface of the printed circuit board 1100 in the direction of −D3.

The plurality of shields 1300a, 1300b and 1300c enable magnetic fields induced by the current flowing through corresponding ones of the plurality of bus bars 1200a, 1200b and 1200c to be respectively concentrated in the internal spaces in the plurality of shields 1300a, 1300b and 1300c. For example, the magnetic field induced by the current flowing through the first bus bar 1200a may be concentrated in the internal space between the first and second vertical parts 1310a and 1330a of the first shield 1300a.

Meanwhile, the magnetic fields induced by the current flowing through the second and third bus bars 1200b and 1200c may be shielded by the first shield 1300a.

For example, the plurality of sensors 1400a, 1400b and 1400c may be mounted on the rear surface of the printed circuit board 1100 so as to respectively correspond to the plurality of bus bars 1200a, 1200b and 1200c and the plurality of shields 1300a, 1300b and 1300c and may respectively detect the magnetic fields induced by the current flowing through the plurality of bus bars 1200a, 1200b and 1200c.

For example, the holding member 1500 may be disposed so as to prevent the plurality of bus bars 1200a, 1200b and 1200c from being respectively spaced apart from the plurality of shields 1300a, 1300b and 1300c corresponding to the plurality of bus bars 1200a, 1200b and 1200c. For example, the holding part 1510 of the holding member 1500 may be disposed so as to contact all of the plurality of bus bars 1200a, 1200b and 1200c.

The fastening parts 1520a and 1520b of the holding member 1500 may be fastened to other components by means of fastening elements such as a bolt and a nut, which pass through at least one through hole formed therethrough. Consequently, since the holding part 1510 is not spaced apart from the horizontal parts 1320a, 1320b and 1320c of the plurality of shields 1300a, 1300b and 1300c, it is possible to prevent the plurality of bus bars 1200a, 1200b and 1200c from being respectively spaced apart from the plurality of shields 1300a, 1300b and 1300c corresponding to the plurality of bus bars 1200a, 1200b and 1200c.

According to the various embodiments of the present disclosure, it is possible to prevent all of the bus bars 1200a, 1200b and 1200c from being respectively spaced apart from the plurality of shields 1300a, 1300b and 1300c using a single holding member 1500.

Figure 11A:
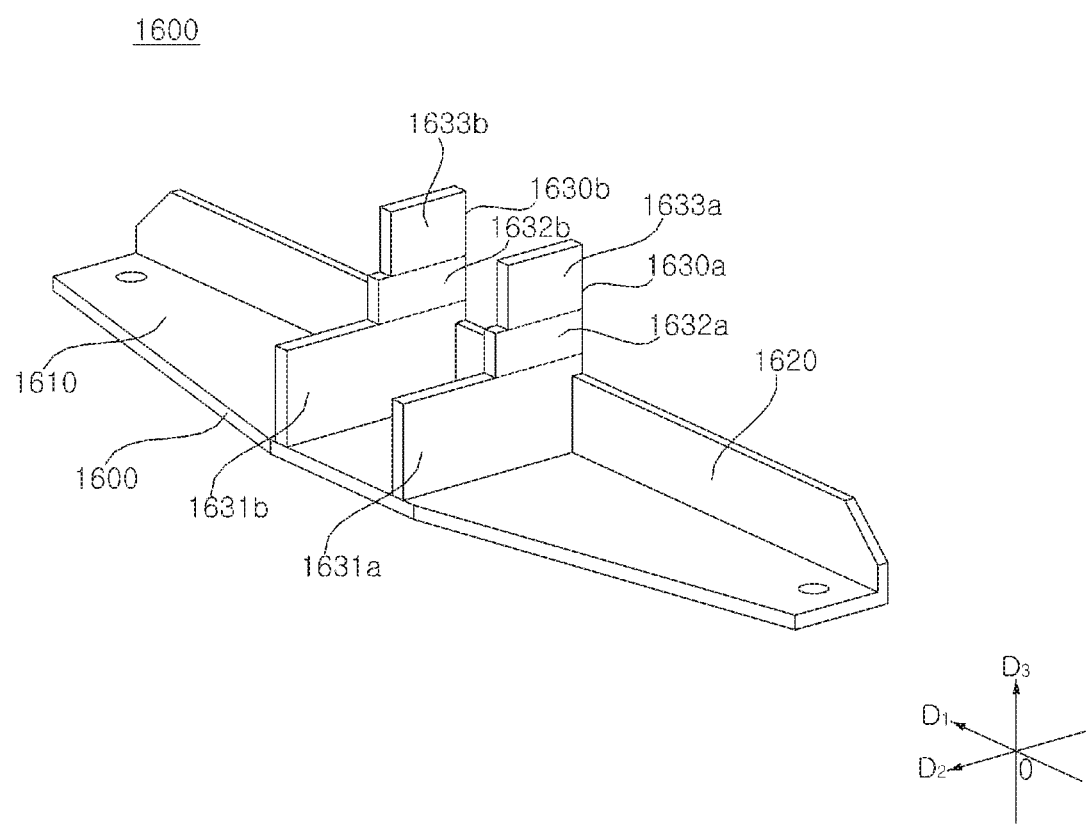
FIG. 11A is a perspective view of a guide member according to an embodiment of the present disclosure, which is viewed in one direction.
Figure 11B:
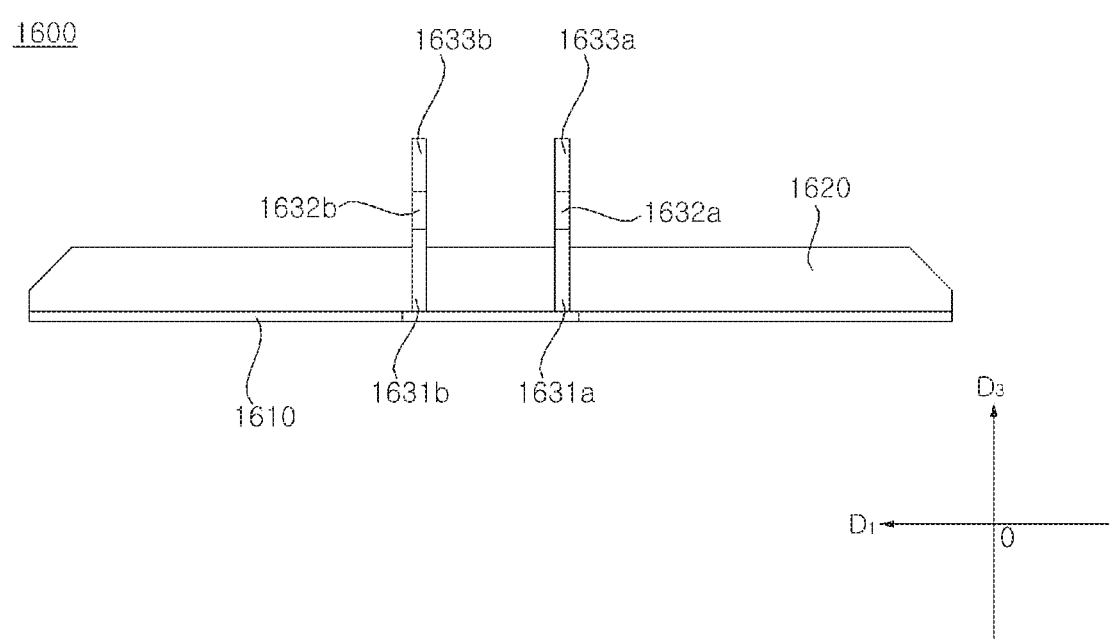
FIG. 11B is a front view of the guide member according to the embodiment of the present disclosure.
Figure 11C:
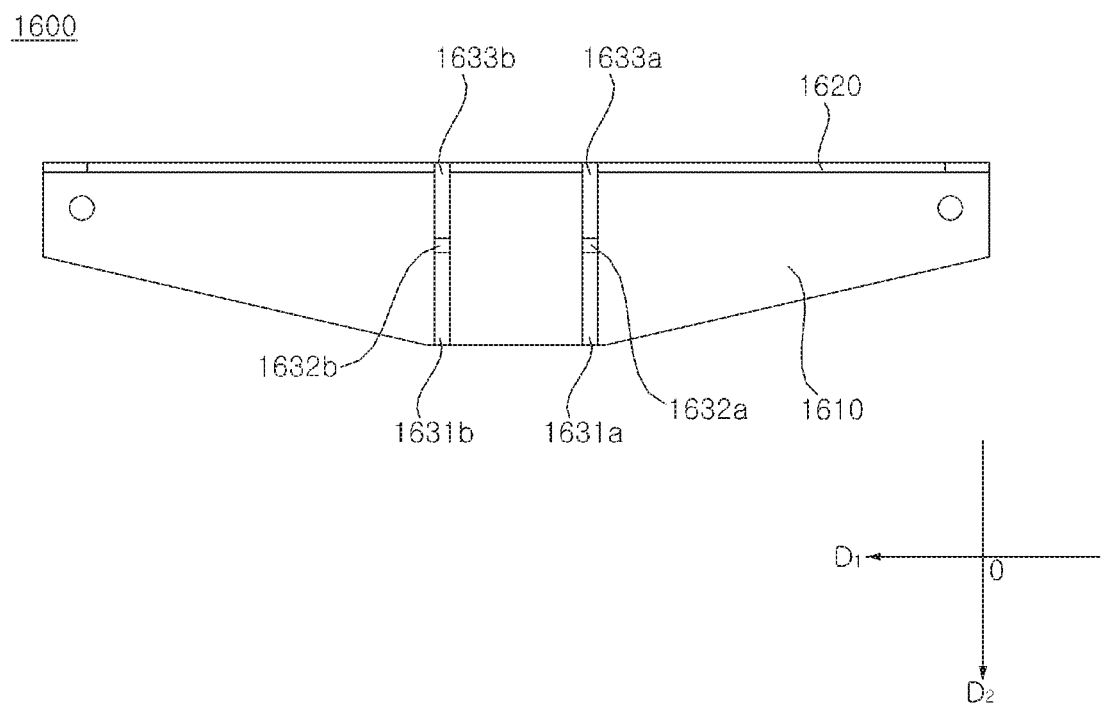
FIG. 11C is a plan view of the guide member according to the embodiment of the present disclosure.

FIG. 11A is a perspective view of a guide member according to an embodiment of the present disclosure, which is viewed in one direction. FIG. 11B is a front view of the guide member according to the embodiment of the present disclosure. FIG. 11C is a plan view of the guide member according to the embodiment of the present disclosure.

Referring to FIGS. 11A to 11C, one of the printed circuit boards 10 according to the various embodiment of the present disclosure may further include the guide member 1600.

For example, the guide member 1600 may be made of an insulator. For example, the guide member 1600 may be made of a synthetic resin insulator.

For example, the guide member 1600 may include a bottom fixing-part 1610, a reinforcing part 1620 and/or a bottom supports 1630a and 1630b.

For example, the bottom fixing-part 1610 may be disposed so as to contact the fastening parts 1520a and 1520b of the holding member 1500.

For example, the bottom fixing-part 1610 may have formed therein at least one through hole, and may be secured to other components by means of fastening elements such as a bolt and a nut. For example, the at least one through hole in the bottom fixing-part 1610 may be positioned so as to correspond to the at least one through hole formed through the fastening parts 1520a and 1520b of the holding member 1500. All of the fastening elements such as a bolt and a nut, may be inserted into the through holes in the bottom fixing-part 1610 and through the through holes in the fastening parts 1520a and 1520b.

Although the bottom fixing-part 1610 of the guide member 1600 is illustrated in the drawings as having the form of a plate, the present disclosure is not limited thereto. It is sufficient for the bottom fixing-part 1610 to have a shape that enables securing of the same to the holding member 1500 by means of the fastening elements such as a bolt and a nut.

For example, the reinforcing part 1620 may be bent from the bottom fixing-part 1610 and may extend therefrom. Although the reinforcing part 1620 is illustrated in the drawings as being vertically bent from the bottom fixing-part 1610 and then extending in the direction of D3, the present disclosure is not limited thereto. The reinforcing part 1620 may be bent from the bottom fixing-part 1610 at a predetermined angle and may extend therefrom.

For example, the reinforcing part 1620 may be connected to first sides of the bottom supports 1630a and 1630b so as to increase the strength of the bottom supports 1630a and 1630b and to distribute stress.

For example, the bottom supports 1630a and 1630b may be connected to the bottom fixing-part 1610 and the reinforcing part 1620. For example, the bottom supports 1630a and 1630b may be perpendicularly connected to the bottom fixing-part 1610 in the direction of D3, and may be perpendicularly connected to the reinforcing part 1620 in the direction of D2.

For example, the first bottom support 1630a and the second bottom support 1630b may be positioned so as to be spaced apart from each other by a predetermined distance. For example, the first bottom support 1630a and the second bottom support 1630b may be spaced apart from each other by a distance equal to or greater than the width w1 of the longitudinal part 1210 of the bus bar 1210 in the direction of D1.

For example, the bottom supports 1630a and 1630b may include printed circuit board supports 1631a and 1631b, fixing-part supports 1632a and 1632b and/or subsidiary supports 1633a and 1633b.

For example, the printed circuit board supports 1631a and 1631b may be disposed so as to contact the rear surface of the printed circuit board 1100. For example, the printed circuit board supports 1631a and 1631b may be disposed such that portions of the upper ends thereof, excluding the portions of the upper ends thereof that are connected to the fixing-part supports 1632a and 1632b, contact the rear surface of the printed circuit board 1100.

For example, the fixing-part supports 1632a and 1632b may be formed by extension of portions of the upper ends of the printed circuit board supports 1631a and 1631b in the direction of D3. For example, the fixing-part supports 1632a and 1632b may be disposed so as to contact the lateral sides and the rear surface of the holding part 1510 of the holding member 1500.

For example, the subsidiary supports 1633a and 1633b may be formed by extension of portions of the upper ends of the fixing-part supports 1632a and 1632b in the direction of D3. For example, the subsidiary supports 1633a and 1633b may be disposed so as to contact the lateral side of the holding part 1510 of the holding member 1500.

Figure 12A:
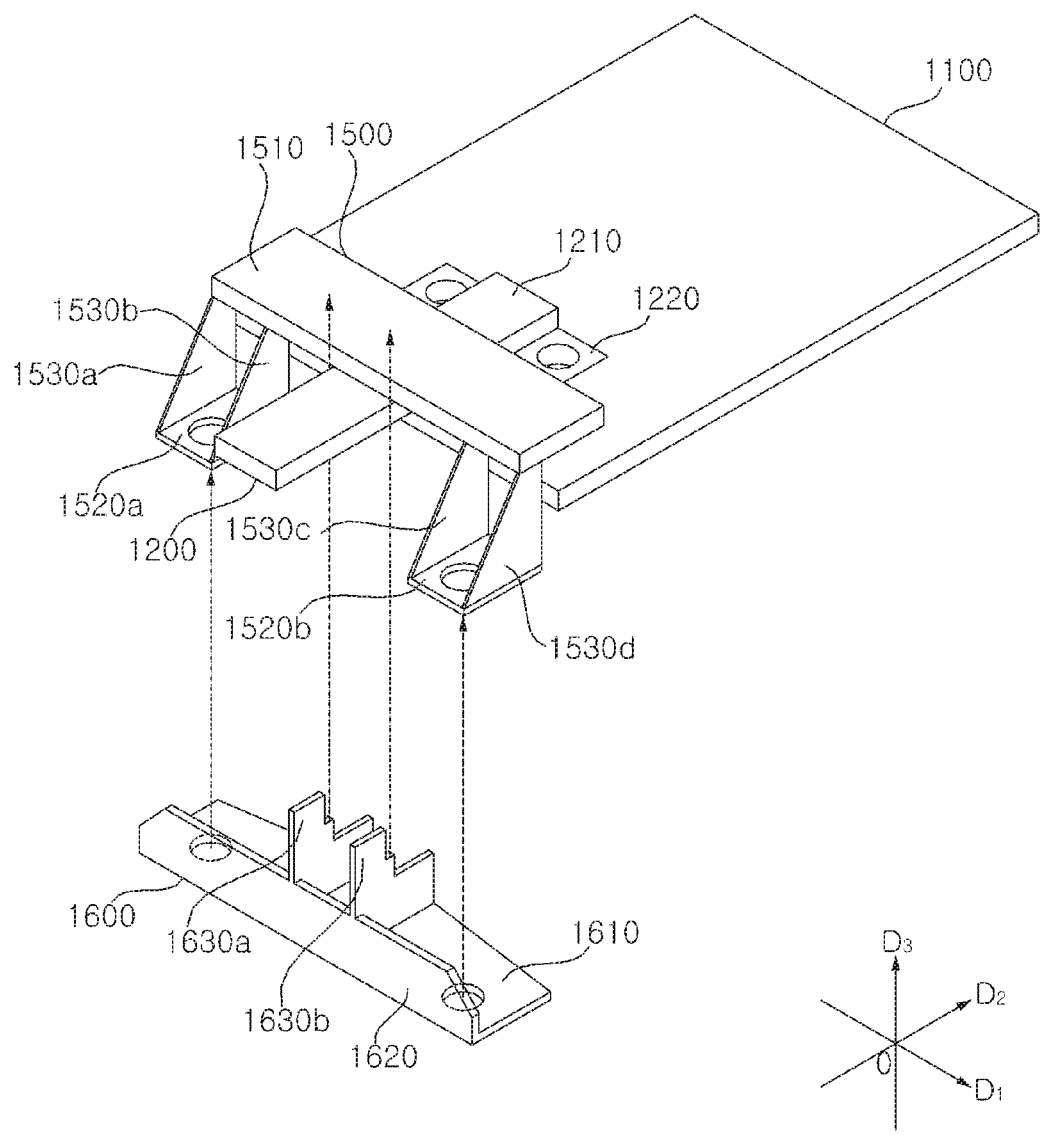
FIG. 12A is a perspective view of the printed circuit board assembly according to the embodiment of the present disclosure, which is viewed in one direction.
Figure 12B:
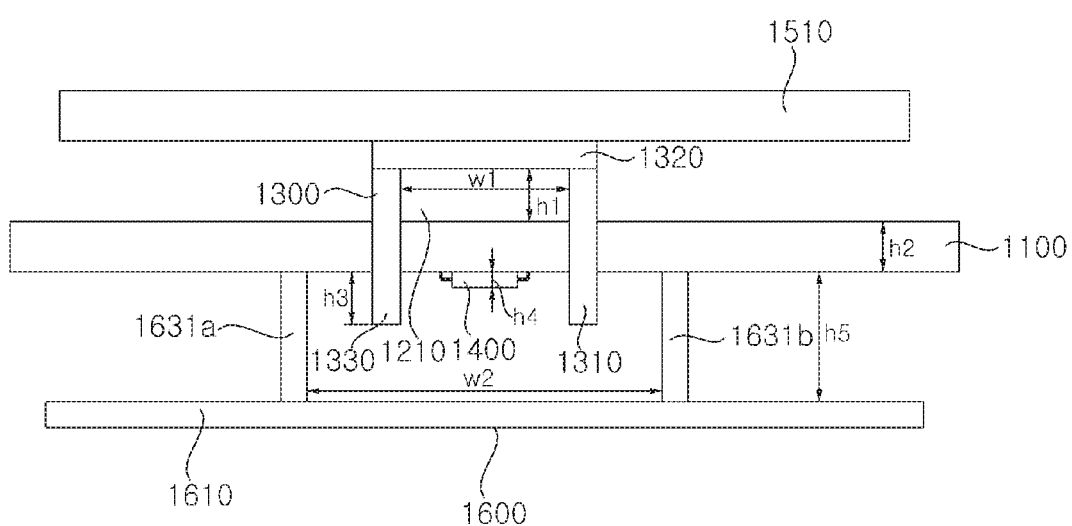
FIG. 12B is a front cross-sectional view of the printed circuit board assembly according to the embodiment of the present disclosure.
Figure 12B:
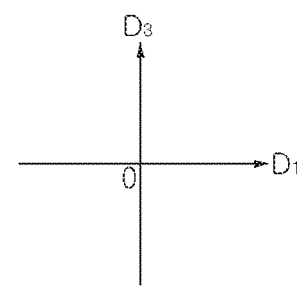
Figure 12C:
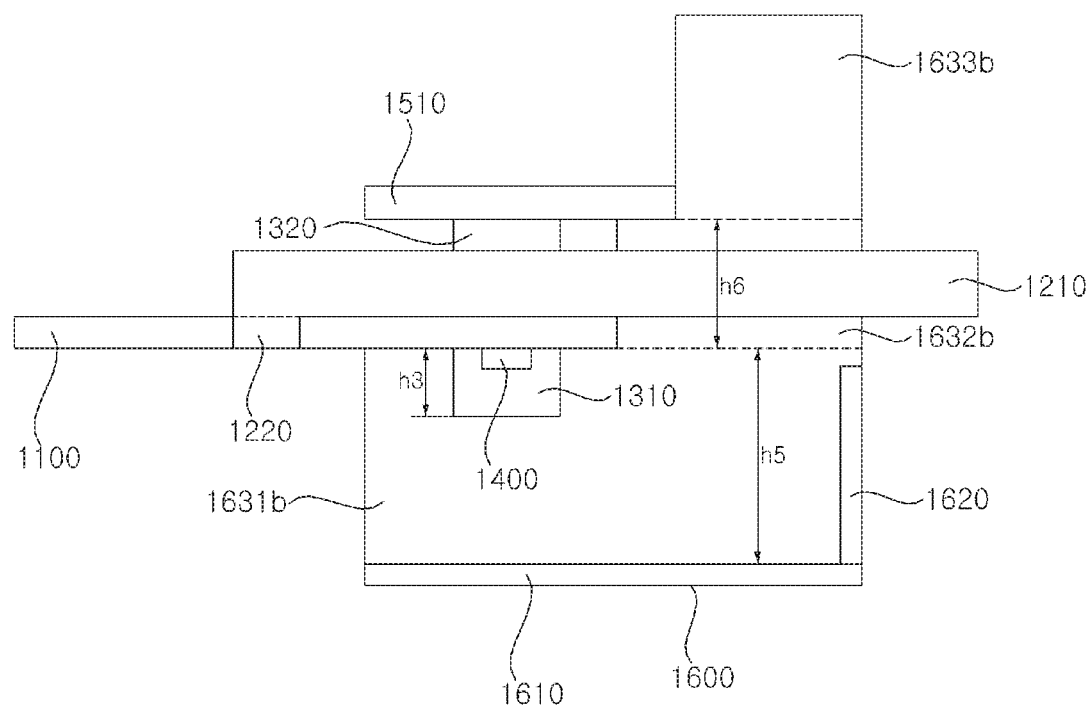
FIG. 12C is a side cross-sectional view of the printed circuit board assembly according to the embodiment of the present disclosure.
Figure 12C:
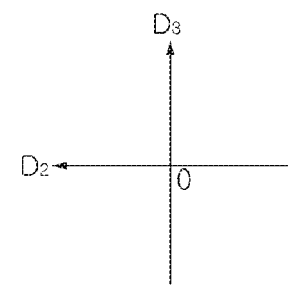

FIG. 12A is a perspective view of the printed circuit board assembly according to the embodiment of the present disclosure, which is viewed in one direction. FIG. 12B is a front cross-sectional view of the printed circuit board assembly according to the embodiment of the present disclosure. FIG. 12C is a side cross-sectional view of the printed circuit board assembly according to the embodiment of the present disclosure.

Referring to FIGS. 12A to 12C, for example, the guide member 1600 may be disposed such that the at least one through hole in the lower fixing-part 1610 corresponds to the at least one through hole in the fastening parts 1520a and 1520b of the holding member 1500.

For example, the guide member 1600 may be disposed such that the longitudinal part 1210 of the bus bar 1200 is positioned between the first bottom support 1630a and the second bottom support 1630b.

For example, the printed circuit board supports 1631a and 1631b of the bottom supports 1630a and 1630b may be disposed so as to contact the rear surface of the printed circuit board 1100.

For example, the height h5 of the printed circuit board supports 1631a and 1631b in the direction of D3 may be equal to or greater than the height h3 in the direction of D3 of the portions of the first and second vertical parts 1310 and 1330 of the shield 1300 that project from the rear surface of the printed circuit board 1100.

For example, the distance w2 between the printed circuit board supports 1631a and 1631b in the direction of D1 may be equal to or greater than the distance w1 between the first and second vertical parts 1310 and 1330 of the shield 1300.

For example, the fixing-part supports 1632a and 1632b of the bottom supports 1630a and 1630b may be disposed so as to contact the lateral side of the printed circuit board 1100 and the rear surface of the holding part 1510 of the holding member 1500.

For example, the height h6 of the fixing-part supports 1632a and 1632b in the direction of D3 may be equal to the sum of the height h2 of the printed circuit board 1100 in the direction of D3, the height hl of the longitudinal part 1210 of the bus bar 1200 in the direction of D3 and the height of the horizontal part 1310 of the shield 1300 in the direction of D3.

For example, the subsidiary supports 1633a and 1633b may be disposed so as to contact the lateral side of the holding part 1510 of the holding member 1500.

Figure 13A:
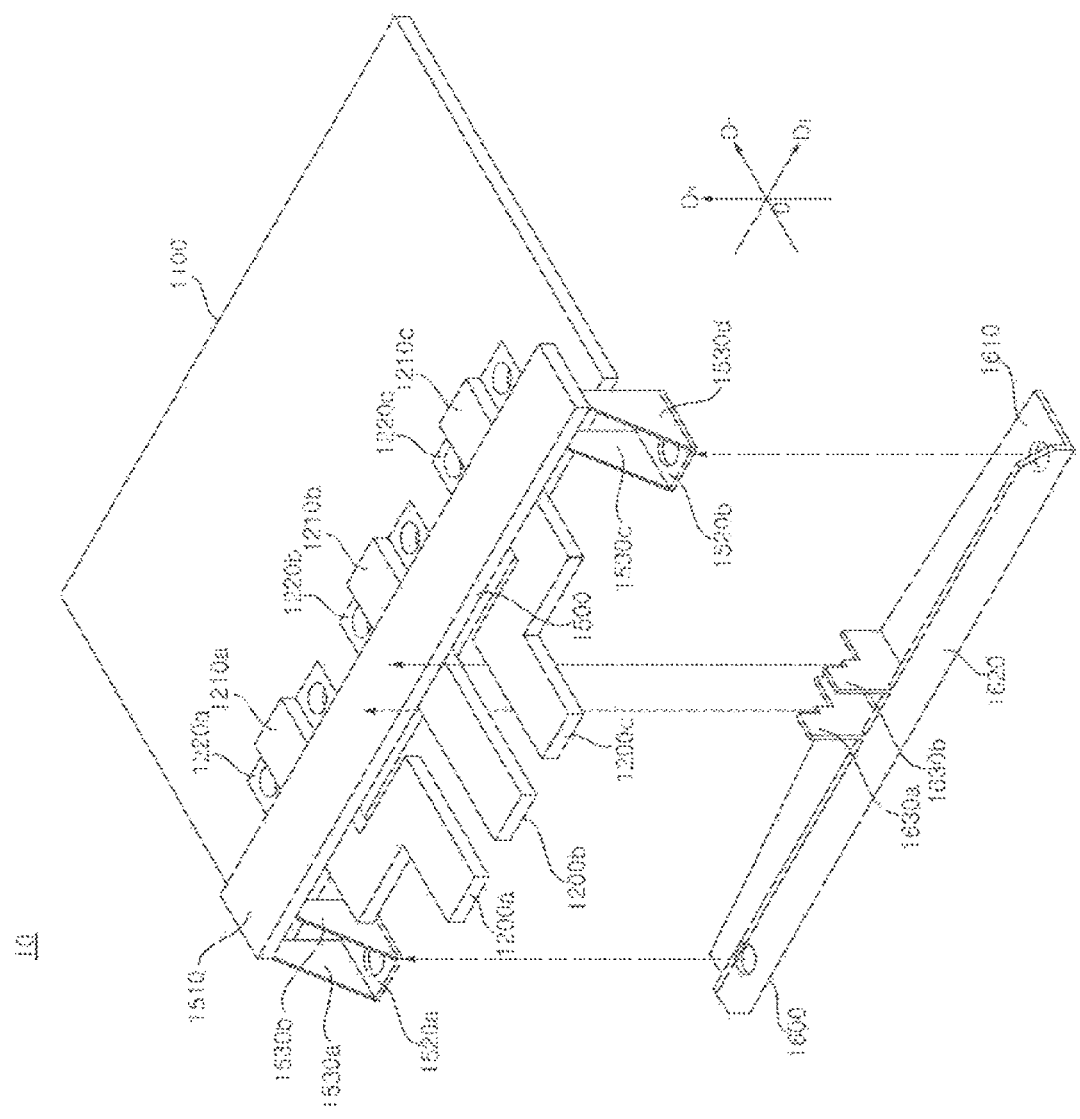
FIG. 13A is a perspective view of a printed circuit board assembly, on which a plurality of current sensors are mounted, according to an embodiment of the present disclosure, which is viewed in one direction.
Figure 13B:
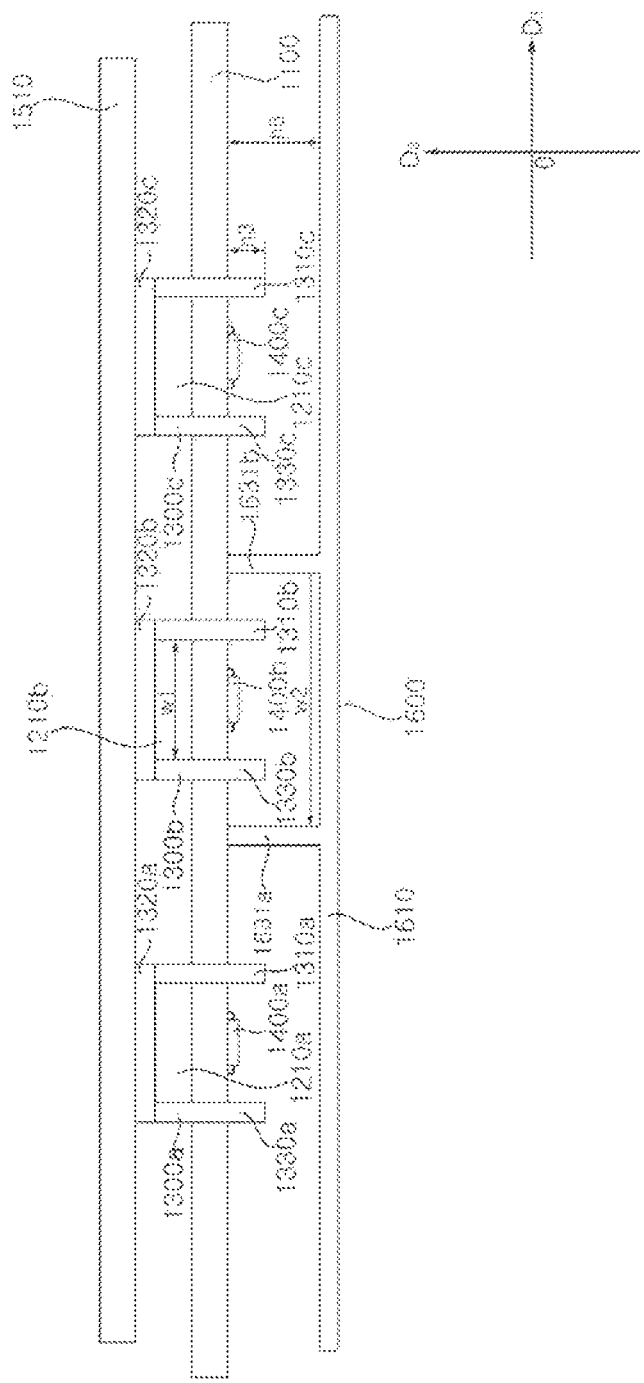
FIG. 13B is a front cross-sectional view of the printed circuit board assembly, on which the plurality of current sensors are mounted, according to the embodiment of the present disclosure.

FIG. 13A is a perspective view of a printed circuit board assembly, on which a plurality of current sensors are mounted, according to an embodiment of the present disclosure, which is viewed in one direction. FIG. 13B is a front cross-sectional view of the printed circuit board assembly, on which the plurality of current sensors are mounted, according to the embodiment of the present disclosure.

Referring to FIGS. 13A and 13B, the guide member 1600 may be disposed such that the at least one through hole in the bottom fixing-part 1610 corresponds to the at least one through hole in the fastening parts 1520a and 1520b of the holding member 1500.

For example, the guide member 1600 may be disposed such that the longitudinal part 1210b of the second bus bar 1200b is positioned between the first bottom support 1630a and the second bottom support 1630b.

For example, the bottom supports 1630a and 1630b may be disposed so as to insulate the plurality of bus bars 1200a, 1200b and 1200c from one another. For example, the bottom supports 1630a and 1630b may be disposed such that the first bottom support 1630a is positioned between the first bus bar 1200a and the second bus bar 1200b and the second bottom support 1630b is positioned between the second bus bar 1200b and the third bus bar 1200c.

For example, the printed circuit board supports 1631a and 1631b of the bottom supports 1630a and 1630b may be disposed so as to contact the rear surface of the printed circuit board 1100.

For example, the height h5 of the printed circuit board supports 1631a and 1631b in the direction of D3 may be equal to or greater than the height h3 in the direction of D3 of the portions of the plurality of shields 1300a, 1300b and 1300c that project from the rear surface of the printed circuit board 1100.

For example, the distance w2 between the printed circuit board supports 1631a and 1631b in the direction of D1 may be equal to or greater than the distance w1 between the first and second vertical parts 1310b and 1330b of the second shield 1300b.

Although the guide member 1600 is illustrated in the drawings as having two bottom supports 1630a and 1630b, the present disclosure is not limited thereto. The printed circuit board assembly 10 may include the bottom supports 1630a and 1630b, the number of which is set such that they are disposed between the plurality of bus bars 1200a, 1200b and 1200c.

According to the various embodiments of the present disclosure, since the printed circuit board assembly 10 further includes the guide member 1600, which is connected to the holding member 1500 by means of fastening elements such as a bolt and a nut, it is possible to more reliably secure the components included in the printed circuit board assembly 10 and thus it is possible to more precisely measure the current flowing through the bus bar 1200.

As is apparent from the above description, since the printed circuit board assembly according to any of the various embodiments of the present disclosure is configured such that the bus bar is held on the printed circuit board, even when the printed circuit board and the bus bar vibrate, the magnetic sensor is able to detect without variation, a magnetic field and thus it is possible to precisely measure the current flowing through the bus bar.

Furthermore, since the printed circuit board assembly according to any of the various embodiments of the present disclosure is able to precisely measure the current flowing through the bus bar, a device provided with the printed circuit board assembly, is able to more precisely perform a control operation based on the detected current value.

In addition, the printed circuit board assembly according to any of the various embodiments of the present disclosure can be reduced in volume.

Furthermore, since the printed circuit board assembly according to any of the various embodiments of the present disclosure is able to prevent the bus bar from being spaced apart from the shield by means of the holding member, it is possible to improve reliability in performance, quality and the like of the printed circuit board assembly.

In addition, the printed circuit board assembly according to any of the various embodiments of the present disclosure is able to prevent all of the plurality of bus bars from being respectively spaced apart from the plurality of shields using a single holding member.

Furthermore, since the printed circuit board assembly according to any of the various embodiments of the present disclosure is constructed such that the current sensor is disposed on the rear surface of the printed circuit board, the bus bar and the shield are 2 0 disposed on the front surface of the printed circuit board and the holding member is disposed on the top of the shield, it is possible to easily and conveniently assemble and disassemble the printed circuit board assembly.

In addition, since the printed circuit board assembly according to any of the various embodiments of the present disclosure further includes the guide member, which is connected to the holding member by means of the fastening elements such as a bolt and a nut, it is possible to more reliably secure the components of the printed circuit board assembly, and thus it is possible to more precisely measure the current flowing through the bus bar.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A printed circuit board assembly comprising:
a printed circuit board;
a bus bar disposed in contact with a front side of the printed circuit board;
a sensor mounted on a rear side of the printed circuit board, the sensor being configured to detect a magnetic field;
a shield disposed around at least a portion of the bus bar; and
a holding member disposed in contact with the shield,
wherein the printed circuit board comprises a plurality of first through holes and a second through hole penetrating from the front side to the rear side,
wherein the bus bar comprises:
a longitudinal part disposed in contact with both the front side of the printed circuit board and the shield; and
a connection part disposed in contact with the longitudinal part and fitted into the second through hole in a direction toward the rear side from the front side of the printed circuit board,
wherein at least a part of the shield is fitted into holes of the plurality of first through holes in the direction toward the rear side from the front side of the printed circuit board so that a rear side of the shield is disposed in contact with the longitudinal part, and
wherein the holding member comprises a top holding part disposed in contact with a front side of the shield.

2. The printed circuit board assembly of claim 1, wherein the holding member further comprises:
a fastening part holding the holding member to a device on which the printed circuit board assembly is mounted; and
a support part connecting the top holding part to the fastening part.

3. The printed circuit board assembly of claim 2, wherein the shield comprises:
a first vertical part;
a horizontal part extending from the first vertical part; and
a second vertical part extending from the horizontal part, wherein the second vertical part faces the first vertical part,
wherein the top holding part of the holding member is disposed in contact with the horizontal part of the shield.

4. The printed circuit board assembly according to claim 3,
wherein the first and second vertical parts are fitted into respective holes of the plurality of first through holes in the direction toward the rear side from the front side of the printed circuit board and extend beyond the rear side of the printed circuit board by a predetermined height, the predetermined height being equal to or greater than a height of the sensor, and
wherein the sensor is disposed between a portion of the first vertical part and a portion of the second vertical part, wherein the portion of the first vertical part and the portion of the second vertical part are portions extending beyond the rear side of the printed circuit board.

5. The printed circuit board assembly according to claim 4,
wherein a rear side of the horizontal part is disposed in contact with the longitudinal part of the bus bar, and
wherein the top holding part of the holding member is disposed in contact with a front side of the horizontal part.

6. The printed circuit board assembly according to claim 5, further comprising a guide member connected to the holding member, the guide member comprising:
a bottom fixing part connected to both a device on which the printed circuit assembly is mounted, and the fastening part of the holding member; and
a bottom support extending from at least a portion of the bottom fixing part in a predetermined direction, the bottom support being disposed in contact with the rear side of the printed circuit board.

7. The printed circuit board assembly according to claim 6, wherein a height of the bottom support is equal to or greater than a height of the portions of the first and second vertical parts extending beyond the rear side of the printed circuit board.

8. The printed circuit board assembly according to claim 7, wherein the bottom support comprises a first bottom support and a second bottom support, and
wherein the longitudinal part of the bus bar is disposed between the first and second bottom supports.

9. A printed circuit board assembly comprising:
a printed circuit board;
a plurality of bus bars disposed in contact with a front side of the printed circuit board;
a plurality of sensors mounted on a rear side of the printed circuit board, the plurality of sensors being configured to detect a magnetic field;
a plurality of shields disposed around at least a portion of a corresponding bus bar of the plurality of bus bars; and
a holding member disposed in contact with the plurality of shields,
wherein the printed circuit board comprises:
a plurality of first through holes penetrating from the front side to the rear side of the printed circuit board, a number of the first through holes corresponding to a number of the plurality of shields, and
the plurality of second through holes penetrating from the front side to the rear side of the printed circuit board, a number of the second through holes corresponding to a number of the plurality of bus bars,
wherein each of the plurality of bus bars comprises:
a longitudinal part disposed in contact with both the front side of the printed circuit board and a corresponding one of the plurality of shields; and
a connection part disposed in contact with the longitudinal part and fitted into a corresponding hole of the plurality of second through holes,
wherein at least a part of each of the plurality of shields is fitted into holes of the plurality of first through holes in a direction toward the rear side from the front side of the printed circuit board so that rear sides of the plurality of shields are disposed respectively in contact with the longitudinal parts of the plurality of bus bars, and
wherein the holding member comprises a top holding part disposed in contact with front sides of the plurality of shields.

10. The printed circuit board assembly of claim 9, wherein the holding member further comprises:
- a fastening part holding the holding member to a device on which the printed circuit board is mounted; and
- a support part connecting the top holding part to the fastening part.

11. The printed circuit board assembly of claim 10, wherein each of the plurality of shields comprises:
- a first vertical part;
- a horizontal part extending from the first vertical part; and
- a second vertical part extending from the horizontal part, wherein the second vertical part faces the first vertical part, and
- wherein the top holding part of the holding member is disposed in contact with the horizontal part.

12. The printed circuit board assembly of claim 11,
- wherein the first and second vertical parts of the plurality of shields are fitted into respective holes of the plurality of first through holes in the direction toward the rear side from the front side of the printed circuit board and extend from the rear side of the printed circuit board by a predetermined height, is the predetermined height being equal to or greater than a height of the plurality of sensors, and
- wherein the plurality of sensors are respectively disposed between a portion of the first vertical part and a portion of the second vertical part, wherein the portion of the first vertical part and the portion of the second vertical part are portions extending beyond the rear side of the printed circuit board.

13. The printed circuit board assembly of claim 12,
- wherein rear sides of the horizontal parts of the plurality of shields are disposed respectively in contact with the longitudinal parts of the plurality of bus bars, and
- wherein the top holding part of the holding member is disposed in contact with front sides of the horizontal parts of the plurality of shields.

14. The printed circuit board assembly of claim 13, further comprising a guide member connected to the holding member, the guide member comprising:
- a bottom fixing-part connected to both a device on which the printed circuit assembly is mounted, and the fastening part of the holding member; and
- at least one bottom support extending from at least a portion of the bottom fixing part in a predetermined direction, the bottom support being disposed in contact with the rear side of the printed circuit board.

15. The printed circuit board assembly of claim 14, wherein a height of the at least one bottom support is equal to or greater than a height of the portions of the first and second vertical parts that extend beyond the rear side of the printed circuit board.

16. The printed circuit board assembly of claim 15, wherein the at least one bottom support comprises a first bottom support and a second bottom support, and
- wherein the first and second bottom supports are respectively disposed between the plurality of bus bars.

* * * * *